United States Patent
Dunn et al.

(10) Patent No.: US 9,574,268 B1
(45) Date of Patent: Feb. 21, 2017

(54) PULSED VALVE MANIFOLD FOR ATOMIC LAYER DEPOSITION

(75) Inventors: Todd Dunn, Cave Creek, AZ (US); Carl White, Gilbert, AZ (US); Mike Halpin, Scottsdale, AZ (US); Eric Shero, Phoenix, AZ (US); Herbert Terhorst, Amersfoort (NL); Jerry Winkler, Gilbert, AZ (US)

(73) Assignee: ASM AMERICA, INC., Phoenix, AZ (US)

(*) Notice: Subject to any disclaimer, the term of this patent is extended or adjusted under 35 U.S.C. 154(b) by 842 days.

(21) Appl. No.: 13/284,738

(22) Filed: Oct. 28, 2011

(51) Int. Cl.
C23C 16/455 (2006.01)
C23C 16/453 (2006.01)

(52) U.S. Cl.
CPC ....... *C23C 16/455* (2013.01); *C23C 16/45512* (2013.01); *C23C 16/45563* (2013.01); *C23C 16/45565* (2013.01); *C23C 16/45574* (2013.01); *C23C 16/45576* (2013.01)

(58) Field of Classification Search
CPC ........ C23C 14/24; C23C 14/243; C23C 14/56; C23C 14/562; C23C 14/568; C23C 16/4485; C23C 16/45548; C23C 16/45551; C23C 16/54; C23C 16/545; C23C 16/448; C23C 16/452; C23C 16/453; C23C 16/455; C23C 16/458
USPC ........................................ 118/715; 156/345.1
See application file for complete search history.

(56) References Cited

U.S. PATENT DOCUMENTS

| 4,401,052 A * | 8/1983 | Baron ................ C23C 14/24 118/715 |
| 4,747,367 A | 5/1988 | Posa |
| 4,828,224 A | 5/1989 | Crabb et al. |
| 4,889,609 A | 12/1989 | Cannella |
| 4,895,107 A | 1/1990 | Yano et al. |

(Continued)

FOREIGN PATENT DOCUMENTS

| DE | 3715644 | 12/1988 |
| JP | H09-186111 | 7/1997 |

(Continued)

OTHER PUBLICATIONS

Unpublished U.S. Appl. No. 13/337,604, filed Dec. 27, 2011.

(Continued)

*Primary Examiner* — Rudy Zervigon
(74) *Attorney, Agent, or Firm* — Knobbe, Martens, Olson & Bear LLP

(57) ABSTRACT

A vapor deposition device includes a reactor including a reaction chamber and an injector for injecting vapor into the reaction chamber. The device also includes a manifold for delivering vapor to the injector. The manifold includes a manifold body having an internal bore, a first distribution channel disposed within the body in a plane intersecting the longitudinal axis of the bore, and a plurality of supply channels disposed within the body and in flow communication with the first distribution channel and with the bore. Each of the first supply channels is disposed at an acute angle with respect to the longitudinal axis of the bore, and each of the supply channels connects with the bore at a different angular position about the longitudinal axis. The distribution channel (and thus, the supply channels) can be connected with a common reactant source. Related deposition methods are also described.

40 Claims, 14 Drawing Sheets

(56) References Cited

U.S. PATENT DOCUMENTS

| | | | |
|---|---|---|---|
| 4,907,534 A | 3/1990 | Huang et al. | |
| 4,949,783 A | 8/1990 | Lakios et al. | |
| 4,951,601 A | 8/1990 | Maydan et al. | |
| 4,990,047 A | 2/1991 | Wagner et al. | |
| 5,071,460 A | 12/1991 | Fujiura et al. | |
| 5,080,549 A | 1/1992 | Goodwin et al. | |
| 5,121,705 A | 6/1992 | Sugino | |
| 5,166,092 A | 11/1992 | Mochizuki et al. | |
| 5,186,718 A | 2/1993 | Tepman et al. | |
| 5,192,371 A | 3/1993 | Shuto et al. | |
| 5,199,483 A | 4/1993 | Bahng | |
| 5,217,501 A | 6/1993 | Fuse et al. | |
| 5,223,001 A | 6/1993 | Saeki | |
| 5,229,615 A | 7/1993 | Brune et al. | |
| 5,248,253 A | 9/1993 | Philipossian et al. | |
| 5,284,519 A * | 2/1994 | Gadgil | C23C 16/455 118/715 |
| 5,286,296 A | 2/1994 | Sato et al. | |
| 5,288,327 A | 2/1994 | Bhat | |
| 5,350,453 A | 9/1994 | Schlosser | |
| 5,388,944 A | 2/1995 | Takanabe et al. | |
| 5,391,035 A | 2/1995 | Krueger | |
| 5,433,785 A | 7/1995 | Saito | |
| 5,462,397 A | 10/1995 | Iwabuchi | |
| 5,488,925 A | 2/1996 | Kumada | |
| 5,516,732 A | 5/1996 | Flegal | |
| 5,520,742 A | 5/1996 | Ohkase | |
| 5,520,743 A | 5/1996 | Takahashi | |
| 5,538,390 A | 7/1996 | Salzman | |
| 5,571,330 A | 11/1996 | Kyogoku | |
| 5,586,585 A | 12/1996 | Bonora et al. | |
| 5,601,651 A | 2/1997 | Watabe | |
| 5,609,459 A | 3/1997 | Muka | |
| 5,728,223 A * | 3/1998 | Murakami | C23C 16/455 118/715 |
| 5,755,878 A | 5/1998 | Habuka et al. | |
| 5,789,027 A | 8/1998 | Watkins et al. | |
| 5,938,840 A | 8/1999 | Habuka et al. | |
| 5,951,771 A * | 9/1999 | Raney | C23C 16/4551 118/723 ER |
| 6,036,783 A * | 3/2000 | Fukunaga | C23C 16/4486 118/724 |
| 6,070,550 A | 6/2000 | Ravi et al. | |
| 6,079,353 A | 6/2000 | Leksell et al. | |
| 6,114,227 A | 9/2000 | Leksell et al. | |
| 6,224,676 B1 | 5/2001 | Nakajima et al. | |
| 6,299,692 B1 * | 10/2001 | Ku | C23C 16/4485 118/715 |
| 6,302,965 B1 * | 10/2001 | Umotoy | C23C 16/16 118/715 |
| 6,303,501 B1 | 10/2001 | Chen et al. | |
| 6,534,133 B1 * | 3/2003 | Kaloyeros | C23C 16/0272 257/E21.295 |
| 6,660,177 B2 * | 12/2003 | Carr | C23C 16/0245 156/345.26 |
| 6,783,590 B2 | 8/2004 | Lindfors et al. | |
| 6,846,516 B2 | 1/2005 | Yang et al. | |
| 6,881,263 B2 | 4/2005 | Lindfors et al. | |
| 6,884,296 B2 * | 4/2005 | Basceri | C23C 16/45514 118/715 |
| 6,899,507 B2 | 5/2005 | Yamagishi et al. | |
| 6,905,547 B1 | 6/2005 | Londergan et al. | |
| 6,916,398 B2 | 7/2005 | Chen et al. | |
| 7,021,881 B2 | 4/2006 | Yamagishi et al. | |
| 7,163,587 B2 * | 1/2007 | Kinnard | C23C 16/45504 118/641 |
| 7,175,713 B2 | 2/2007 | Thakur et al. | |
| 7,195,037 B2 | 3/2007 | Eidsmore | |
| 7,204,886 B2 | 4/2007 | Chen et al. | |
| 7,297,892 B2 * | 11/2007 | Kelley | B08B 7/0035 219/121.36 |
| 7,304,263 B2 * | 12/2007 | Chang | H05H 1/30 156/345.39 |
| 7,311,851 B2 * | 12/2007 | Carr | C23C 16/0245 216/58 |
| 7,402,210 B2 | 7/2008 | Chen et al. | |
| 7,408,225 B2 | 8/2008 | Shinriki et al. | |
| 7,591,907 B2 | 9/2009 | Chen et al. | |
| 7,591,957 B2 * | 9/2009 | Carr | B23K 1/206 216/24 |
| 7,670,399 B2 * | 3/2010 | Park | F01N 3/038 118/715 |
| 7,780,785 B2 * | 8/2010 | Chen | C23C 16/34 118/715 |
| 7,780,789 B2 | 8/2010 | Wu et al. | |
| 7,918,938 B2 | 4/2011 | Provencher et al. | |
| 8,070,879 B2 | 12/2011 | Chen et al. | |
| 8,137,463 B2 * | 3/2012 | Liu | H01J 37/32449 118/715 |
| 8,152,922 B2 | 4/2012 | Schmidt et al. | |
| 8,211,230 B2 | 7/2012 | Verghese et al. | |
| 8,298,336 B2 * | 10/2012 | Wang | H01J 37/32357 118/715 |
| 8,372,201 B2 * | 2/2013 | Provencher | C23C 16/45536 118/715 |
| 8,425,682 B2 * | 4/2013 | Wang | H01J 37/32357 118/715 |
| 8,465,801 B2 | 6/2013 | Schmidt et al. | |
| 8,668,776 B2 * | 3/2014 | Chen | C23C 16/34 118/715 |
| 8,784,563 B2 | 7/2014 | Schmidt et al. | |
| 2001/0003015 A1 | 6/2001 | Chang et al. | |
| 2001/0006093 A1 | 7/2001 | Tabuchi et al. | |
| 2002/0007790 A1 | 1/2002 | Park | |
| 2002/0072164 A1 | 6/2002 | Umotoy et al. | |
| 2002/0081381 A1 | 6/2002 | DelaRosa et al. | |
| 2002/0195055 A1 * | 12/2002 | Grant | C23C 16/455 118/715 |
| 2003/0010451 A1 | 1/2003 | Tzu et al. | |
| 2003/0019428 A1 * | 1/2003 | Ku | C23C 16/455 118/715 |
| 2003/0056720 A1 | 3/2003 | Dauelsberg et al. | |
| 2003/0070620 A1 * | 4/2003 | Cooperberg | C23C 16/45574 118/723 AN |
| 2003/0079686 A1 | 5/2003 | Chen et al. | |
| 2003/0101938 A1 | 6/2003 | Ronsse et al. | |
| 2003/0106643 A1 | 6/2003 | Tabuchi et al. | |
| 2003/0172872 A1 | 9/2003 | Thakur et al. | |
| 2003/0180460 A1 * | 9/2003 | Strauch | C23C 16/45508 427/248.1 |
| 2004/0028810 A1 * | 2/2004 | Grant | C23C 16/4412 427/248.1 |
| 2004/0035358 A1 * | 2/2004 | Basceri | C23C 16/45514 118/715 |
| 2004/0118342 A1 | 6/2004 | Cheng et al. | |
| 2004/0144311 A1 * | 7/2004 | Chen | C23C 16/45502 118/715 |
| 2005/0000428 A1 | 1/2005 | Shero et al. | |
| 2005/0000656 A1 * | 1/2005 | Carr | B23K 1/206 156/345.48 |
| 2005/0009325 A1 * | 1/2005 | Chung | C23C 16/02 438/637 |
| 2005/0092247 A1 | 5/2005 | Schmidt et al. | |
| 2005/0173068 A1 * | 8/2005 | Chen | C23C 16/34 156/345.33 |
| 2005/0208217 A1 | 9/2005 | Shinriki et al. | |
| 2005/0252449 A1 * | 11/2005 | Nguyen | C23C 16/0272 118/715 |
| 2005/0263197 A1 | 12/2005 | Eidsmore | |
| 2005/0271812 A1 | 12/2005 | Myo et al. | |
| 2006/0096540 A1 * | 5/2006 | Choi | C23C 16/45574 118/724 |
| 2006/0266289 A1 | 11/2006 | Verghese et al. | |
| 2007/0026147 A1 * | 2/2007 | Chen | C23C 16/34 427/248.1 |
| 2007/0095285 A1 | 5/2007 | Thakur et al. | |
| 2007/0128864 A1 | 6/2007 | Ma et al. | |
| 2007/0187634 A1 | 8/2007 | Sneh | |
| 2007/0194470 A1 | 8/2007 | Dedontney | |
| 2008/0085226 A1 | 4/2008 | Fondurulia et al. | |

(56) References Cited

U.S. PATENT DOCUMENTS

| | | | |
|---|---|---|---|
| 2008/0102203 A1* | 5/2008 | Wu | C23C 16/34 427/248.1 |
| 2008/0102208 A1 | 5/2008 | Wu et al. | |
| 2008/0162580 A1 | 7/2008 | Harush | |
| 2008/0202416 A1 | 8/2008 | Provencher et al. | |
| 2009/0196992 A1 | 8/2009 | Schmidt et al. | |
| 2010/0003406 A1 | 1/2010 | Lam et al. | |
| 2010/0024727 A1* | 2/2010 | Kim | C23C 16/45565 118/715 |
| 2010/0048032 A1* | 2/2010 | Sangam | C23C 16/405 438/785 |
| 2010/0266765 A1 | 10/2010 | White et al. | |
| 2010/0310772 A1* | 12/2010 | Tsuda | C23C 16/409 427/255.28 |
| 2011/0098841 A1* | 4/2011 | Tsuda | C23C 16/409 700/117 |
| 2012/0079984 A1 | 4/2012 | Schmidt et al. | |
| 2014/0261178 A1 | 9/2014 | Du Bois et al. | |

FOREIGN PATENT DOCUMENTS

| | | |
|---|---|---|
| WO | WO 90/10092 | 9/1990 |
| WO | WO 01/29282 A2 | 4/2001 |

OTHER PUBLICATIONS

Office Action for Chinese Patent Application No. 200780002793.9, issued Mar. 15, 2010.
Office Action for Chinese Patent Application No. 200780002793.9, issued Apr. 19, 2011.
Notice for Reasons for Rejection dated Feb. 28, 2012 for Japanese Patent Application No. 2008551324, filed Jul. 16, 2008, 5 pages.

* cited by examiner

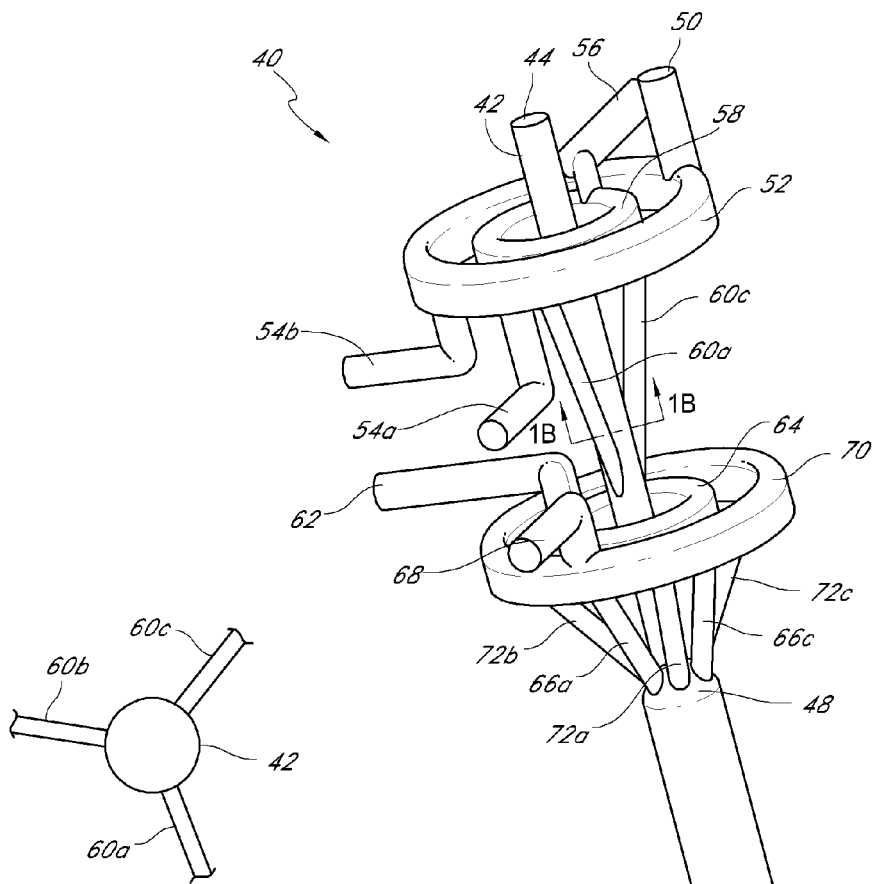
FIG. 1B
FIG. 1C
FIG. 1A

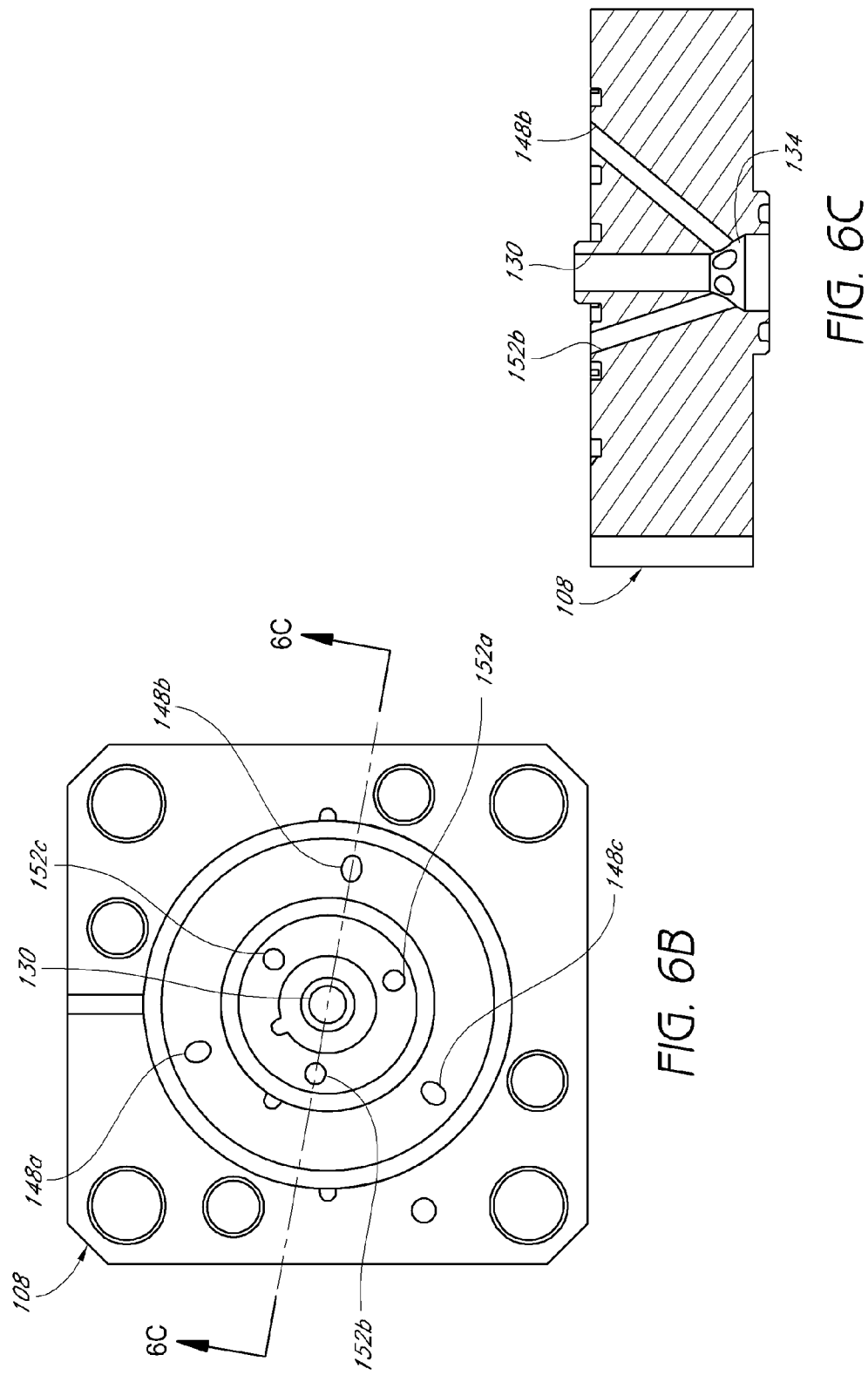

US 9,574,268 B1

PULSED VALVE MANIFOLD FOR ATOMIC LAYER DEPOSITION

BACKGROUND OF THE INVENTION

Field of the Invention

This application relates generally to semiconductor processing equipment and specifically to an apparatus for delivering vapors in an atomic layer deposition (ALD) device.

Description of the Related Art

There are several vapor deposition methods for depositing thin films on the surface of substrates. These methods include vacuum evaporation deposition, Molecular Beam Epitaxy (MBE), different variants of Chemical Vapor Deposition (CVD) (including low-pressure and organometallic CVD and plasma-enhanced CVD), and Atomic Layer Deposition (ALD).

In an ALD process, one or more substrates with at least one surface to be coated are introduced into the reactor or deposition chamber. The substrate is heated to a desired temperature, typically above the condensation temperatures of the selected vapor phase reactants and below their thermal decomposition temperatures. One reactant is capable of reacting with the adsorbed species of a prior reactant to form a desired product on the substrate surface. The product can be in the form of a film, liner or layer on the substrate. Two, three or more reactants are provided to the substrate, typically in spatially and temporally separated pulses.

In an example, in a one pulse a first reactant representing a precursor material is adsorbed largely intact in a self-limiting process on a wafer. The process is self-limiting because the vapor phase precursor cannot react with or adsorb upon the adsorbed portion of the precursor. After any remaining first reactant is removed from the wafer or chamber, the adsorbed precursor material on the substrate may be decomposed or reacted with a subsequent reactant pulse to form no more than a single molecular layer of the desired material. The subsequent reactant may, e.g., strip ligands from the adsorbed precursor material to make the surface reactive again, replace ligands and leave additional material for a compound, etc. In an unadulterated ALD process, less than a monolayer is formed per cycle on average due to steric hindrance, whereby the size of the precursor molecules prevent access to adsorption sites on the substrate, which may become uncovered through subsequent cycles. Thicker films are produced through repeated growth cycles until the target thickness is achieved. Growth rate is often provided in terms of angstroms per cycle because in theory the growth depends solely on number of cycles, and has no dependence upon mass supplied or temperature, as long as each pulse is saturative and the temperature is within the ideal ALD temperature window for those reactants (no thermal decomposition and no condensation).

Reactants and temperatures are typically selected to avoid both condensation and thermal decomposition of the reactants during the process, such that chemical reaction is responsible for growth through multiple cycles. However, in certain variations on ALD processing, conditions can be selected to vary growth rates per cycle, possibly beyond one molecular monolayer per cycle, by hybridizing CVD and ALD reaction mechanisms. Other variations maybe allow some amount of spatial and/or temporal overlap between the reactants. In ALD and variations thereof, two, three, four or more reactants can be supplied in sequence in a single cycle, and the content of each cycle can be varied to tailor composition.

During a typical ALD process, the reactant pulses, all of which are in vapor form, are pulsed sequentially into a reaction space (e.g., reaction chamber) with removal steps between reactant pulses to avoid direct interaction between reactants in the vapor phase. For example, inert gas pulses or "purge" pulses can be provided between the pulses of reactants. The inert gas purges the chamber of one reactant pulse before the next reactant pulse to avoid gas phase mixing. A characteristic feature of ALD is that each reactant is delivered to the substrate until a saturated surface condition is reached. The cycles are repeated to form an atomic layer of the desired thickness. To obtain a self-limiting growth, a sufficient amount of each precursor is provided to saturate the substrate. As the growth rate in each cycle of a true ALD process is self-limiting, the rate of growth is proportional to the repetition rate of the reaction sequences rather than to the flux of reactant.

Designing and operating an ALD reactor to both minimize interaction among reactants and provide fast switching between reactant pulses is challenging.

SUMMARY OF THE INVENTION

The systems and methods of the present invention have several features, no single one of which is solely responsible for its desirable attributes. Without limiting the scope of this invention as expressed by the claims which follow, its more prominent features will now be discussed briefly. After considering this discussion, and particularly after reading the section entitled "Detailed Description of Preferred Embodiments," one will understand how the features described herein provide several advantages over traditional ALD gas delivery methods and systems.

One aspect is a vapor deposition device including a reactor including a reaction chamber and an injector configured to inject vapor into the reaction chamber and a manifold configured to deliver vapor to the injector, the manifold being disposed upstream of the injector. The manifold includes a manifold body having a bore disposed within the body, the bore having a longitudinal axis; a first distribution channel disposed within the body and extending in a plane intersecting the longitudinal axis; and a plurality of first supply channels disposed within the body and in flow communication with the first distribution channel and with the bore, each of the first supply channels being disposed at an acute angle with respect to the longitudinal axis of the bore, each of the first supply channels connecting with the bore at a different angular position about the longitudinal axis.

In another aspect, a method of deposition includes providing a manifold configured to deliver vapor to an injector, the manifold comprising a manifold body having a bore disposed within the body, the bore having a longitudinal axis, and conducting an ALD process using the manifold. The ALD process includes supplying an inert gas to an inlet of the bore, supplying a first reactant vapor to the bore such that the first reactant vapor enters the bore at a plurality of angular positions about the longitudinal axis of the bore and at an acute angle with respect to the longitudinal axis of the bore, and providing the first reactant vapor from the bore to the injector.

BRIEF DESCRIPTION OF THE DRAWINGS

These and other features, aspects and advantages of the present invention will now be described with reference to the drawings of several embodiments, which embodiments are intended to illustrate and not to limit the invention.

FIG. 1A is a schematic illustration of a flow path through an ALD inlet manifold according to an embodiment.

FIG. 1B is a schematic partial transverse cross-section of the flow path shown in FIG. 1A, taken along lines 1B-1B.

FIG. 1C is a schematic partial transverse cross-section of the flow path through a manifold at the same location as FIG. 1B, but according to another embodiment.

FIG. 6B is a top plan view of the lower block of the manifold of FIG. 2.

FIG. 6C is a cross-sectional view taken along lines 6C-6C of FIG. 6B.

DETAILED DESCRIPTION OF PREFERRED EMBODIMENTS

Figure 2:
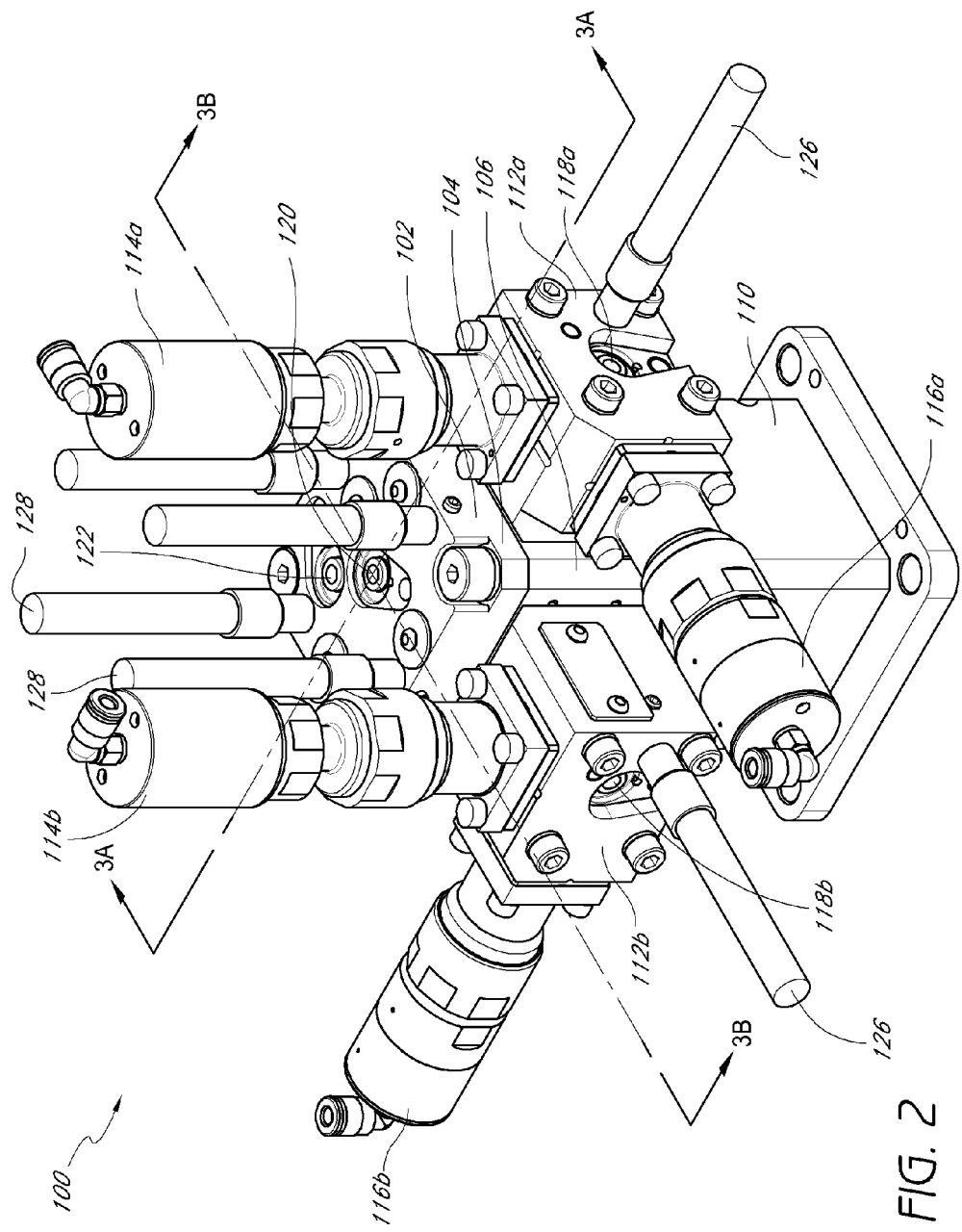
FIG. 2 is an isometric view of an ALD inlet manifold configured in accordance with an embodiment.

In order to maintain the precursors/reactants in vapor or gaseous form, the reactor, as well as the gas lines leading to the reactor, should be maintained at an appropriate temperature and often are heated. If the temperatures in the lines or reaction chamber are too low, condensation may occur and corrupt the ALD process. If the temperatures in the lines or reaction chamber are too high, the gases may degrade or decompose, which will also corrupt the ALD process. Maintaining certain components of the reactor at low pressures within a vacuum chamber can also aid delivery of saturative pulses without undue breakdown of the reactants.

In some ALD processes, depending on the types of precursors/reactants being used, the reactant storage containers and delivery lines can be continuously maintained at temperatures ranging from room temperature (or slightly below room temperature) to 300° C. Many ALD recipes employ substrate temperatures in the 75° C. to 300° C. range, with some recipes employing substrate temperatures between 500° C. and 600° C. Such high temperature requirements can limit the ability to use valves in the gas lines in the vacuum chamber, particularly in the lines close to the reactor. Moving such components outside the ALD hot zone can result in long pulse response times because of the distance between the source valve (outside the vacuum chamber) and the reactor, greater risk of diffusion of a reactant from a long line into the reactor between pulses of that reactant, long times required to purge lines and reactor of the previous reactant because of the lengths of gas lines between the source valve and the reactor, and/or increased potential for condensation of the precursor or reactant while it travels between the source valve and the reactor due to variations in temperature in longer gas lines.

As will be understood by the skilled artisan, the gases used in the ALD process (i.e., precursor/reactant gases and carrier/purge gases) are supplied to the manifold from outside of the reactor housing. The precursor/reactant gases may be liquid, gas or solid at room temperature. Some gases used for ALD are naturally gaseous (i.e., are in gas phase at room temperature and atmospheric pressure), while other reactants suitable for ALD processing are often liquid or solid at room temperature and atmospheric pressure and so are vaporized for processing. Conversion of each precursor/reactant into a gas can be performed outside of the reactor housing in a vaporizer apparatus (not shown). Maintaining thermal control is particularly important for vaporized precursors in ALD processing.

The precursor/reactant gases can be mixed with a carrier gas, which may be an inert gas such as nitrogen or argon, before entering the manifold. A single ALD apparatus may have multiple sources of reactants and/or carrier and purge gases, each of which may have its own lines to (and within) the manifold. In some cases, a single source of inert gas can serve as a supply of both carrier gas and purge gas from separate lines to different points in the gas distribution system, or a single line can act as carrier gas during some phases of the ALD process and act as purge gas at other phases. As used herein, the terms "gas" and "vapor" can be used interchangeably to refer to any reactant or inert gas that is in a gas phase, regardless of whether it is naturally gaseous or vaporized from a solid or liquid.

In embodiments described herein, an ALD device can include a manifold having an internal bore, at least one distribution channel extending generally in a plane intersecting the longitudinal axis of the bore, and a plurality of internal supply channels connecting the distribution channel and the bore. Inert gas can be constantly supplied to an upstream inlet of the bore, so as to provide a "sweep" flow from the top to the bottom of the bore. The distribution channel can be connected to a reactant vapor source, which can be a gas tank or a vaporizer. In some embodiments, the distribution channel can follow a circular curvature. In some embodiments, the distribution channel can extend through an arc of at least 180° but less than 300°, such as, for example, an arc of about 240°, and such an arcuate (rather than annular) channel can be referred to as a C-shaped channel. Relative to a completely closed loop, the C-shaped channels illustrated herein have a smaller volume, have no dead zones between outlets, and are quicker and easier to purge.

The supply channels connecting the distribution channel to the bore can be angled with respect to the longitudinal axis of the bore (as viewed in a longitudinal cross-section). The supply channels can be connected to or merge with the bore at multiple, spaced-apart locations about a longitudinal axis of the bore. In some embodiments, the supply channels can also connect with the bore in a tangential fashion (as viewed in a transverse cross-section) so as to promote swirling and further enhance mixing within the bore. By introducing each reactant gas to the bore at a plurality of locations about the bore in this manner, mixing is promoted at the point of injection into the bore. The constant flow of inert gas can serve to purge the mixing volume inside the bore, and can also serve as a diffusion barrier between pulses of reactant gas. The constant flow of inert gas can also serve as a diffusion barrier to protect against reactants migrating and stagnating in the bore upstream of the merge point for reactants. In embodiments, the bore can have length-to-diameter (L/D) ratio for each reactant of greater than 3, greater than 5, or greater than 10, where the L/D ratio is measured from point of merger with the bore for that reactant to the outlet of the bore, and the diameter is an average diameter along the reactant path length along the bore. The volume of the bore can thus be reduced as compared to conventional ALD systems, aiding in quick diffusion of the reactant across the bore prior to delivery into the reaction chamber. Indeed, it is of particular interest to quickly ensure diffusion of the reactant across the entire diameter of the bore where a dispersion mechanism (e.g., showerhead assembly) intervenes between the manifold and the reaction space. If concentration uniformity is not achieved within the bore before the gases enter the dispersion mechanism, the non-uniformity will be carried through the dispersion mechanism and into the reaction space, which can result in non-uniform deposition. The features of the distributed supply channels and the narrow and long bore, individually and collectively, facilitate a uniform distribution of reactant across the cross-section of the cylindrical "plug" of each reactant pulse.

The manifold can be disposed within the ALD hot zone, and can be configured to deliver gases to an injector (e.g., a showerhead) for distribution into a reaction chamber. Embodiments can also include one or more heaters configured to maintain thermal uniformity within the manifold, reducing the risk of decomposition or condensation within the manifold.

Atomic Layer Deposition (ALD)

Among vapor deposition techniques, ALD has many advantages, including high conformality at low temperatures and fine control of composition during the process. ALD type processes are based on controlled, self-limiting surface reactions of precursor chemicals. Gas phase reactions are avoided by feeding the precursors alternately and sequentially into the reaction chamber. Vapor phase reactants are separated from each other in the reaction chamber, for example, by removing excess reactants and/or reactant by-products from the reaction chamber between reactant pulses. Removal can be accomplished by a variety of techniques, including purging and/or lowering pressure between pulses. Pulses can be sequential in a continuous flow, or the reactor can be isolated and can backfilled for each pulse.

Briefly, a substrate is loaded into a reaction chamber and is heated to a suitable deposition temperature, generally at lowered pressure. Deposition temperatures are typically maintained below the precursor thermal decomposition temperature but at a high enough level to avoid condensation of reactants and to provide the activation energy for the desired surface reactions. Of course, the appropriate temperature window for any given ALD reaction will depend upon the surface termination and reactant species involved.

A first reactant is conducted into the chamber in the form of vapor phase pulse and contacted with the surface of a substrate. Conditions are preferably selected such that no more than about one monolayer of the precursor is adsorbed on the substrate surface in a self-limiting manner. Excess first reactant and reaction byproducts, if any, are purged from the reaction chamber, often with a pulse of inert gas such as nitrogen or argon.

Purging the reaction chamber means that vapor phase precursors and/or vapor phase byproducts are removed from the reaction chamber such as by evacuating the chamber with a vacuum pump and/or by replacing the gas inside the reactor with an inert gas such as argon or nitrogen. Typical purging times for a single wafer reactor are from about 0.05 to 20 seconds, more preferably between about 1 and 10, and still more preferably between about 1 and 2 seconds. However, other purge times can be utilized if necessary, such as when depositing layers over extremely high aspect ratio structures or other structures with complex surface morphology is needed, or when a high volume batch reactor is employed. The appropriate pulsing times can be readily determined by the skilled artisan based on the particular circumstances.

A second gaseous reactant is pulsed into the chamber where it reacts with the first reactant bound to the surface. Excess second reactant and gaseous by-products of the surface reaction are purged out of the reaction chamber, preferably with the aid of an inert gas. The steps of pulsing and purging are repeated until a thin film of the desired thickness has been formed on the substrate, with each cycle leaving no more than a molecular monolayer. Some ALD processes can have more complex sequences with three or more precursor pulses alternated, where each precursor contributes elements to the growing film. Reactants can also be supplied in their own pulses or with precursor pulses to strip or getter adhered ligands and/or free by-product, rather than contribute elements to the film. Additionally, not all cycles need to be identical. For example, a binary film can be doped with a third element by infrequent addition of a third reactant pulse, e.g., every fifth cycle, in order to control stoichiometry of the film, and the frequency can change during the deposition in order to grade film composition. Moreover, while described as starting with an adsorbing reactant, some recipes may start with the other reactant or with a separate surface treatment to ensure maximal reaction sites to initiate the ALD reactions (e.g., for certain recipes, a water pulse can provide hydroxyl groups on the substrate to enhance reactivity for certain ALD precursors).

As mentioned above, each pulse or phase of each cycle is preferably self-limiting. An excess of reactant precursors is supplied in each phase to saturate the susceptible structure surfaces. Surface saturation ensures reactant occupation of all available reactive sites (subject, for example, to physical size or steric hindrance restraints) and thus ensures excellent step coverage over any topography on the substrate. In some arrangements, the degree of self-limiting behavior can be adjusted by, e.g., allowing some overlap of reactant pulses to trade off deposition speed (by allowing some CVD-type reactions) against conformality. Ideal ALD conditions with reactants well separated in time and space provide near perfect self-limiting behavior and thus maximum conformality, but steric hindrance results in less than one molecular layer per cycle. Limited CVD reactions mixed with the self-limiting ALD reactions can raise the deposition speed. While embodiment described herein are particularly advantageous for sequentially pulsed deposition techniques, like ALD and mixed-mode ALD/CVD, the manifold can also be employed for pulsed or continuous CVD processing.

Examples of suitable reactors that may be used include commercially available ALD equipment such as any of the EmerALD® or Eagle® series reactors, available from ASM International of Almere, the Netherlands. Many other kinds of reactors capable of ALD growth of thin films, including CVD reactors equipped with appropriate equipment and means for pulsing the precursors, can be employed. In some embodiments a flow type ALD reactor is used, as compared to a backfilled reactor. In some embodiments, the manifold is upstream of an injector designed to distribute gas into the reaction space, particularly a dispersion mechanism such as a showerhead assembly above a single-wafer reaction space.

The ALD processes described below can optionally be carried out in a reactor or reaction space connected to a cluster tool. In a cluster tool, because each reaction space is dedicated to one type of process, the temperature of the reaction space in each module can be kept constant, which improves the throughput compared to a reactor in which is the substrate is heated to the process temperature before each run. A stand-alone reactor can be equipped with a load-lock. In that case, it is not necessary to cool down the reaction space between each run. These processes can also be carried out in a reactor designed to process multiple substrates simultaneously, e.g., a mini-batch type showerhead reactor.

FIG. 1A is a schematic illustration of a flow path 40 through a manifold according to another embodiment. FIG. 1A illustrates the configuration of various channels inside the manifold, without showing the structure of the manifold itself, so as to better illustrate the relative orientation and interconnection of the internal channels of a manifold in some embodiments. The illustrated flow path 40 includes a bore 42 with an inert gas inlet 44 and an outlet 46. The cross-sectional area of the bore 42 increases between the inlet 44 and the outlet 46. In the illustrated embodiment, the cross-sectional area increases at a tapered portion 48, which in the illustrated embodiment coincides with a merger of some of the reactant flow paths, as described below. The flow path 40 also includes a second inert gas inlet 50 which is in fluid communication with an inert gas distribution channel 52. The inert gas distribution channel 52 extends generally in a plane intersecting the longitudinal axis of bore 42. Although the illustrated inert gas distribution channel 52 follows a circular curvature and extends a full 360°, in some embodiments, inert or reactant gas distribution channels can have other shapes (e.g., elliptical), and need not be a closed shape, that is, can extend only partway about the longitudinal axis of the bore, such as the C-shaped channels described below with respect to FIGS. 2-7D.

The inert gas distribution channel 52 feeds inert gas to two inert gas passageways 54*a*, 54*b*, each of which can be connected to an inert gas valve (not shown in FIG. 1A). The inert gas passageways 54*a*, 54*b* connect with the inert gas distribution channel 52 at different angular locations distributed about the axis of the bore 42 (as viewed in a transverse cross-section). In the illustrated embodiment, the inert gas passageways 54*a*, 54*b* connect with the inert gas distribution channel 52 about 90° apart from one another, and about 135° (in opposite directions) from where the inert gas inlet 50 connects with the inert gas distribution channel 52.

The flow path 40 also includes a reactant gas inlet 56 which is in fluid communication with a reactant gas distribution channel 58. The reactant gas distribution channel 58 extends generally in a plane intersecting the longitudinal axis of bore 42. In the illustrated embodiment, the reactant gas distribution channel 58 extends in generally the same plane as the inert gas distribution channel 52 (i.e., at generally the same longitudinal location along the bore 42 as the inert gas distribution channel 52), and is generally concentric with the inert gas distribution channel 52. As described with respect to the inert gas distribution channel 52, the reactant gas distribution channel 58 need not be a closed shape, that is, can extend only partway about the longitudinal axis of the bore, such as the C-shaped channels described below with respect to FIGS. 2-7D. The reactant gas distribution channel 58 conveys inert gas to multiple, e.g., three reactant gas supply channels 60*a*, 60*b*, 60*c* (only two of which are visible in FIG. 1A), each of which connects with the reactant gas distribution channel 58 at a different angular location about the axis of the bore 42 (as viewed in a transverse cross-section). In other arrangements, there can be fewer or more than three supply channels leading from the reactant gas distribution channel 58. In the illustrated embodiment, each of the reactant gas supply channels 60*a*, 60*b*, 60*c* connect with the reactant gas distribution channel 58 at a location which is angularly offset from where the reactant gas inlet 56 connects with the reactant gas distribution channel 58.

The reactant gas supply channels 60*a*, 60*b*, 60*c* also connect with the bore 42 at different angular locations distributed about the axis of the bore (as viewed in a transverse cross-section), and at an angle with respect to the longitudinal axis of the bore 42 (as viewed in a longitudinal cross-section). In the illustrated embodiment, the reactant gas supply channels 60*a*, 60*b*, 60*c* connect with the reactant gas distribution channel 58 and with the bore 42 at locations about 120° apart (about the bore axis) from one another, i.e., at evenly spaced locations around the bore 42.

The flow path 40 also includes another reactant gas inlet 62 which is in fluid communication with a reactant gas distribution channel 64. The reactant gas distribution channel 64 extends generally in a plane intersecting the longitudinal axis of bore 42. As described with respect to the inert gas distribution channel 52, the reactant gas distribution channel 64 need not be a closed shape, that is, can extend only partway about the longitudinal axis of the bore, such as the C-shaped channels described below with respect to FIGS. 2-7D. In the illustrated embodiment, the reactant gas distribution channel 64 extends in a plane at a different longitudinal location than the inert gas distribution channel 52 and the reactant gas distribution channel 58. The reactant gas distribution channel 64 conveys reactant gas to multiple, e.g., three reactant gas supply channels 66*a*, 66*b*, 66*c* (only two of which are visible in FIG. 1A), each of which connects with the reactant gas distribution channel 64 at a different angular location about the axis of the bore 42 (as viewed in a transverse cross-section). In the illustrated embodiment, the reactant gas supply channels 66*a*, 66*b*, 66*c* connect with the reactant gas distribution channel 64 at locations about 120° apart (about the bore axis) from one another. In addition, each of the reactant gas supply channels 66*a*, 66*b*, 66*c* connect with the reactant gas distribution channel 64 at a location which is angularly offset from where the reactant gas inlet 62 connects with the reactant gas distribution channel 64.

The reactant gas supply channels 66*a*, 66*b*, 66*c* also connect with the bore 42 at different angular locations about the axis of the bore (as viewed in a transverse cross-section), and at an angle with respect to the longitudinal axis of the bore (as viewed in a longitudinal cross-section). In the illustrated embodiment, the reactant gas supply channels 66a, 66b, 66c connect with the reactant gas distribution channel 64 and with the bore 42 at locations about 120° apart (about the bore axis) from one another, i.e., at evenly spaced locations around the bore 42.

The flow path 40 also includes a further reactant gas inlet 68 which is in fluid communication with a reactant gas distribution channel 70. The reactant gas distribution channel 70 extends generally in a plane intersecting the longitudinal axis of bore 42. As described with respect to the inert gas distribution channel 52, the reactant gas distribution channel 70 need not be a closed shape, that is, can extend only partway about the longitudinal axis of the bore, such as the C-shaped channels described below with respect to FIGS. 2-7D. In the illustrated embodiment, the reactant gas distribution channel 70 extends in generally the same plane as the reactant gas distribution channel 64 (i.e., at generally the same longitudinal location along the bore 42 as the reactant gas distribution channel 64), and is generally concentric with respect to the reactant gas distribution channel 64. The reactant gas distribution channel 70 conveys reactant gas to multiple, e.g., three reactant gas supply channels 72a, 72b, 72c, each of which connects with the reactant gas distribution channel 70 at a different angular location about the axis of the bore 42 (as viewed in a transverse cross-section). In the illustrated embodiment, the reactant gas supply channels 72a, 72b, 72c connect with the reactant gas distribution channel 70 at locations about 120° apart (about the bore axis) from one another. In addition, each of the reactant gas supply channels 72a, 72b, 72c connects with the reactant gas distribution channel 70 at a location which is angularly offset from where the reactant gas inlet 68 connects with the reactant gas distribution channel 70.

The reactant gas supply channels 72a, 72b, 72c also connect with the bore 42 at different angular locations about the axis of the bore 42 (as viewed in a transverse cross-section), and at an angle with respect to the longitudinal axis of the bore 42 (as viewed in a longitudinal cross-section). In the illustrated embodiment, the reactant gas supply channels 72a, 72b, 72c connect with the reactant gas distribution channel 70 and with the bore 42 at locations about 120° apart (about the bore axis) from one another, i.e., at evenly spaced locations around the bore 42. Further, each of the reactant gas supply channels 72a, 72b, 72c connects with the bore 42 at a location which is angularly offset from where the reactant gas supply channels 66a, 66b, 66c connect with the bore. The reactant gas supply channels 72a, 72b, 72c also connect with the bore 42 at a greater angle than the reactant gas supply channels 66a, 66b, 66c due to the reactant gas distribution channel 70 being a greater distance from the bore 42 than the reactant gas distribution channel 64. Additionally, the bore 42 widens at the tapered portion 48 where the reactant gas supply channels 66a, 66b, 66c, 72a, 72b, 72c merge with the bore 42. This allows a smoother merger and mixing of the reactants entering at this point with flow of gas (e.g., inert gas) that enters at upstream portions of the bore 42.

FIG. 1B is a schematic partial transverse cross-section of the flow path shown in FIG. 1A, taken along lines 1B-1B. As shown in FIG. 1B, the reactant gas supply channels 60a, 60b, 60c connect with the bore 42 at different angular locations about the axis of the bore. As also shown in FIG. 1B, horizontal components of the reactant gas supply channels 60a, 60b, 60c extend in a radial direction from the axis (or, from the center) of the bore. The horizontal components of the reactant gas supply channels 66a, 66b, 66c and the reactant gas supply channels 72a, 72b, 72c can also connect with the bore in a radial fashion. Here, "horizontal" is meant to convey components of the supply channels in the plane of the cross-section, transverse to the bore axis, rather than any particular orientation relative to ground.

FIG. 1C is a schematic partial transverse cross-section of the flow path through a manifold according to another embodiment which includes a bore 80 and three reactant gas supply channels 82a, 82b, 82c. As shown in FIG. 1C, horizontal components of the reactant gas supply channels 82a, 82b, 82c connect tangentially with the bore 82 (i.e., out of alignment with the center of the bore). Such a configuration can serve to promote swirling and mixing of gases inside the bore. In embodiments, any or all of the gas supply channels can connect with the bore in a tangential manner in the plane transverse to the bore axis.

In operation, an inert gas can be supplied to the bore 42 through the inlet 44. With this inert gas constantly flowing, a first reactant gas valve (not shown) can be opened for a period of time to supply a first reactant gas to the bore 42 through the inlet 56, via the distribution channel 58 and the supply channels 60a, 60b, 60c. Because the first reactant is injected at multiple angular locations about the bore 42, a well-mixed cylindrical slice or "plug" of the first reactant gas is created in the bore 42, fully diffused across the bore 42 at a point close downstream of the injection point (at lines 1B-1B), such that the bore 42 need not be excessively lengthy to accomplish a uniform distribution within the plug before it leaves the bore 42 at outlet 46.

After the first reactant pulse is stopped, and optionally after a sufficiently long duration of purging to purge the bore and the downstream reaction space (and any intervening distribution mechanism like an expander or showerhead) by continued inert gas flow through the bore 42, a second reactant gas valve (not shown) can be opened for a period of time to supply a second reactant gas to the bore 42 through the inlet 62, via the distribution channel 64 and the supply channels 66a, 66b, 66c. Because the second reactant is injected at multiple angular locations about the bore 42, a plug of the second reactant gas is created in the bore 42, fully diffused across the bore 42 at a point very close downstream of the injection point (at tapered portion 48).

After the second plug is created, an inert gas valve (not shown) can be opened for a period of time to supply an inert gas from the inert gas channel 52 to the bore 42, via the outlet 54b, the second reactant gas valve and the inlet 62. In this way, the inert gas flows through the second reactant gas valve and flushes or purges the distribution channel 64 and the supply channels 66a, 66b, 66c of any remaining second reactant gas, thereby preventing reactant diffusion during subsequent steps. At the same time, inert gas can continue to flow from the inlet 44 through the bore 42, and together both sources of inert gas can purge the manifold, any intervening distribution mechanism and the downstream reaction space of the second reactant.

A two-reactant ALD recipe can then cycle through the above process as desired. Alternatively, in a more complicated ALD recipe, after the second reactant is removed (e.g., purged as described above) a third reactant gas valve (not shown) can be opened for a period of time to supply a third reactant gas to the bore 42 through the inlet 68, via the distribution channel 70 and the supply channels 72a, 72b, 72c. Because the third reactant is injected at multiple angular locations about the bore 42, a plug of the third reactant gas is created in the bore 42, fully diffused across the bore 42 at a point very close downstream of the injection point (at tapered portion 48).

After the third plug is created, an inert gas valve (not shown) can be opened for a period of time to supply an inert gas from inert gas channel 52 to the bore 42, via the outlet 54a, the second reactant gas valve and the inlet 68. In this way, the inert gas flows through the second reactant gas valve and flushes or purges the distribution channel 70 and the supply channels 72a, 72b, 72c of any remaining third reactant gas, thereby preventing reactant diffusion during subsequent steps. At the same time, inert gas can continue to flow from the inlet 44 through the bore 42, and together both sources of inert gas can purge the manifold, any intervening distribution mechanism and the downstream reaction space of the third reactant.

During this process, the inert gas supplied through inlet 44 can act as a carrier gas for each precursor or reactant gas during precursor/reactant pulses, as well as a purge gas between precursor/reactant pulses. The constant flow of inert gas through inlet 44 prevents upward diffusion of the reactants, creates a gas phase barrier (also referred to as a diffusion barrier) between the plugs or pulses of reactant, and pushes the plugs down toward the toward the outlet 46 for distribution into a reactor (e.g., by a showerhead). As will be understood by one of skill in the art, the illustrated flow path 40 and the manifold of FIGS. 2-7D that can define it can also be employed with alternative processes for removing reactant from the manifold and downstream reaction space between reactant pulses. While the above process employs a continuous flow of inert and/or reactant gases, with reactant gases being injected into a continual inert gas flow, ALD can also be conducted by closing the reactor's exhaust and backfilling the reaction space for each reactant pulse, the reactor can be purged and/or pumped down between pulses. Residence time for each pulse can also be varied, e.g., by pulsing with one flow rate and/or pressure, and purging with another flow rate and/or pressure. For example, a pump isolation valve that exhausts the reaction space be left open and a throttle valve can be employed to control pressure and flow rates.

As will be understood by the skilled artisan, an ALD recipe may employ two, three, four or more reactants or precursors per cycle, pulses of which are generally (but not necessarily) separated by a reactant removal (e.g., purging) stage. The entire process can be repeated as desired in order to build up a layer of a desired thickness on the substrate in the reactor. The skilled artisan will also appreciate that not every cycle in a given ALD process is necessarily identical with all other cycles in the process, and changes may be made to tailor composition and profile of the thin film being deposited.

FIGS. 2-7D illustrate a particular example of a manifold 100 configured to provide a flow path similar to the flow path 40 of FIG. 1A. The embodiment illustrated in FIGS. 2-7D comprises a plurality of assembled blocks in which curved segments of the flow path can be readily machined into surfaces of the blocks to define surface grooves and linear segments can be readily machined into the depth of the blocks. The skilled artisan will appreciate, however, that flow paths having the functional equivalence of the path 40 described with respect to FIG. 1A can be provided in manifolds with different constructions by other techniques, e.g., molding, casting, lost wax techniques, etc. While the illustrated blocks provide separate flow paths into a central bore for three separate reactants, fewer or more reactants can be provided. The skilled artisan will readily appreciate from the description below that the manifold 100 design is readily scalable by addition of blocks for supply of additional reactants.

FIG. 2 is an isometric view of the ALD manifold 100 configured in accordance with an embodiment. As shown in FIG. 2, the manifold 100 comprises a body 102 that includes four blocks: an upper block 104, an intermediate block 106, a lower block 108 (not visible in FIG. 2A), and a diffuser block 110. Although FIG. 2 shows a composite manifold body 102 comprising four stacked sub-portions, some embodiments can comprise fewer or more sub-portions, while others can comprise a monolithic manifold body. Mounted on the body 102 are two valve blocks 112a, 112b. An inert gas valve 114a and a reactant gas valve 116a are mounted on the valve block 112a. An inert gas valve 114b and a reactant gas valve 116b are mounted on the valve block 112b. Each of the valve blocks 112a, 112b can include a reactant gas inlet 118a, 118b. At upper block 104, the manifold body 102 includes two inert gas inlets 120, 122. Although not visible in FIG. 2, the manifold body 102 can also include a reactant gas inlet 124 (see FIGS. 3A and 4A). The reactant gas inlets 118a, 118b, and 124 can be connected to different reactant sources, some of which may be naturally gaseous (i.e., gaseous at room temperature and atmospheric pressure), and some of which may be solid or liquid under standard conditions.

The body 102 can also include one or more heaters 128. Each of the valve blocks 112a, 112b can also include one or more heaters 126, 128. The heaters 126, 128 can be disposed in such a manner as to maintain as constant a temperature as possible throughout the body and/or the valve blocks. The heaters 126, 128 can be any type of heater that can operate at high temperatures suitable for ALD processes, including without limitation linear rod-style, heater jacket, heater blank, heat trace tape, or coiled resistance heaters.

Figure 3A:
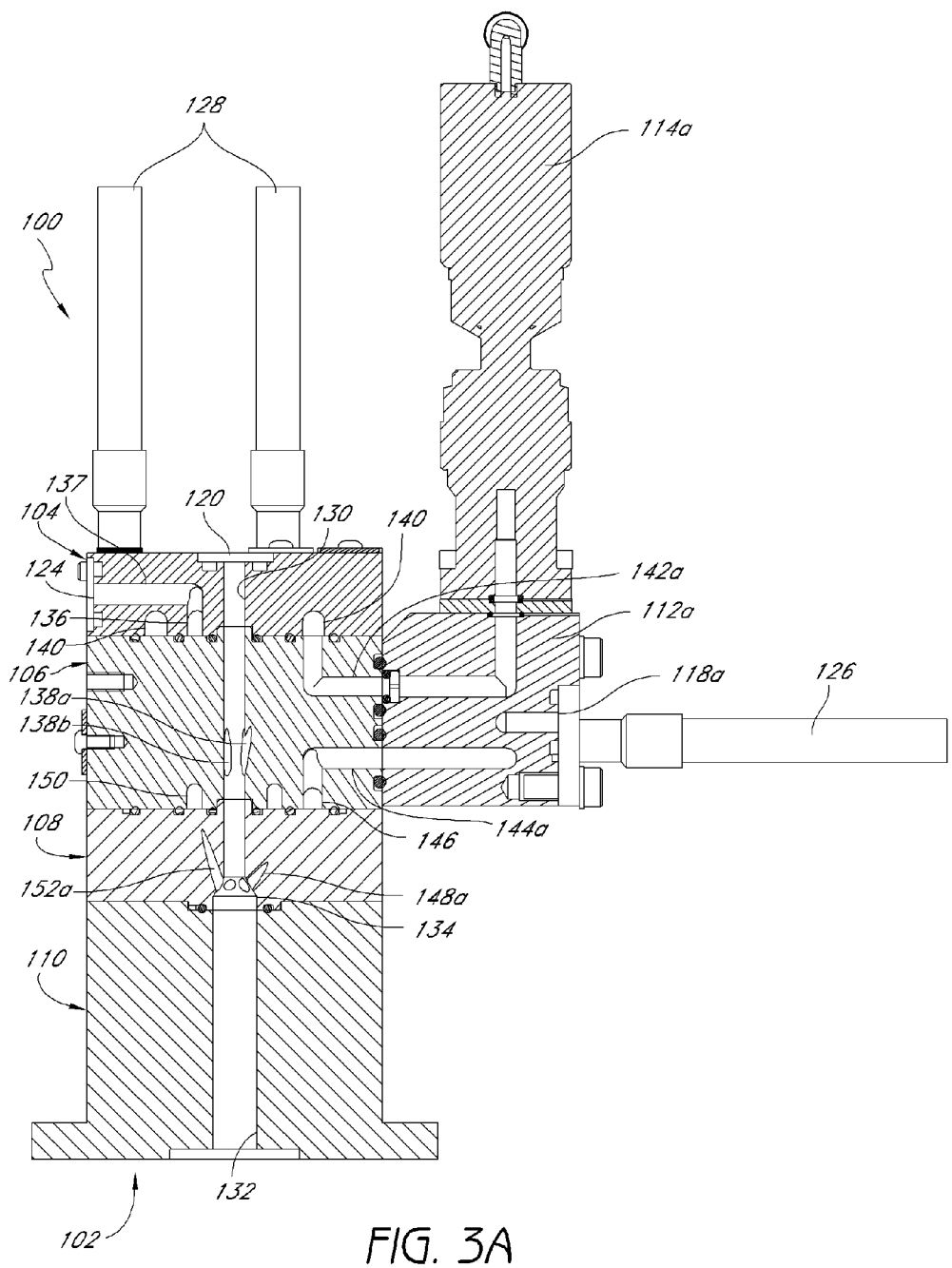
FIG. 3A is a cross-sectional view taken along lines 3A-3A of FIG. 2.

FIG. 3A is a cross-sectional view taken along lines 3A-3A of FIG. 2 and illustrates certain passageways in the body 102 in further detail. As shown in FIG. 3A, the inert gas inlet 120 at the top of the manifold body 102 connects with a bore 130 that extends longitudinally through the body 102 to an outlet 132. The bore 130 has a larger cross-sectional area near the outlet 132 than it does near the inlet 120. In the illustrated embodiment, the increase in cross-sectional area occurs at a tapered portion 134 of the bore 130. Although not illustrated, an expander or other segment may be connected to the bottom of the manifold 100 to widen the flow path between the outlet 132 of the bore 130 and a downstream dispersion mechanism.

The reactant gas inlet 124 connects with a distribution channel 136 in the body 102 via a passageway 137. The distribution channel 136 is formed by lower and upper surfaces, respectively, of the upper block 104 and the intermediate block 106, and extends in a plane that intersects with the longitudinal axis of the bore 130, and is normal to the bore axis in the illustrated embodiment. The distribution channel 136 is in fluid communication with the bore 130 via three reactant gas supply channels 138a, 138b, 138c (only two of which are partially visible in FIG. 3A near their points of merger with the bore 130), which connect with the bore 130 at a location downstream of the distribution channel 136.

The inert gas inlet 122 (see FIG. 2) connects with an inert gas distribution channel 140 in the body 102. The inert gas distribution channel 140 is formed by lower and upper surfaces, respectively, of the upper block 104 and the intermediate block 106, and extends in a plane that intersects the longitudinal axis of the bore 130, and is normal to the bore axis in the illustrated embodiment. In some embodiments, the inert gas channel 140 can be disposed at about the same longitudinal location as the distribution channel 136. The inert gas distribution channel 140 supplies inert gas to the inert gas valve 114a via a passageway 142a. As shown in FIG. 3A, the passageway 142a extends through the intermediate block 106 and the valve block 112a. The inert gas distribution channel 140 also supplies inert gas to the inert gas valve 114b via a passageway 142b (see FIG. 3B).

With continued reference to FIG. 3A, the inert gas valve 114a controls a supply of inert gas from the passageway 142a (and thus, from the inert gas distribution channel 140) to the reactant gas valve 116a (see FIG. 2). The reactant gas valve 116a controls a supply of a reactant gas from the inlet 118a (or a mixture of a reactant gas from the inlet 118a and an inert gas from the inert gas valve 114a) to a passageway 144a, which is connected to a distribution channel 146 in the body 102. As shown in FIG. 3A, the passageway 144a extends through the valve block 112a and the intermediate block 106. The distribution channel 146 is formed by lower and upper surfaces, respectively, of the intermediate block 106 and the lower block 108, and extends in a plane that intersects the longitudinal axis of the bore 130, and is normal to the bore axis in the illustrated embodiment. The distribution channel 146 is in fluid communication with the bore 130 via three supply channels 148a, 148b, 148c (only one of which is partially visible near its point of merger with the bore 130 in FIG. 3A), which connect with the bore 130 at a location downstream of the distribution channel 146.

Figure 3B:
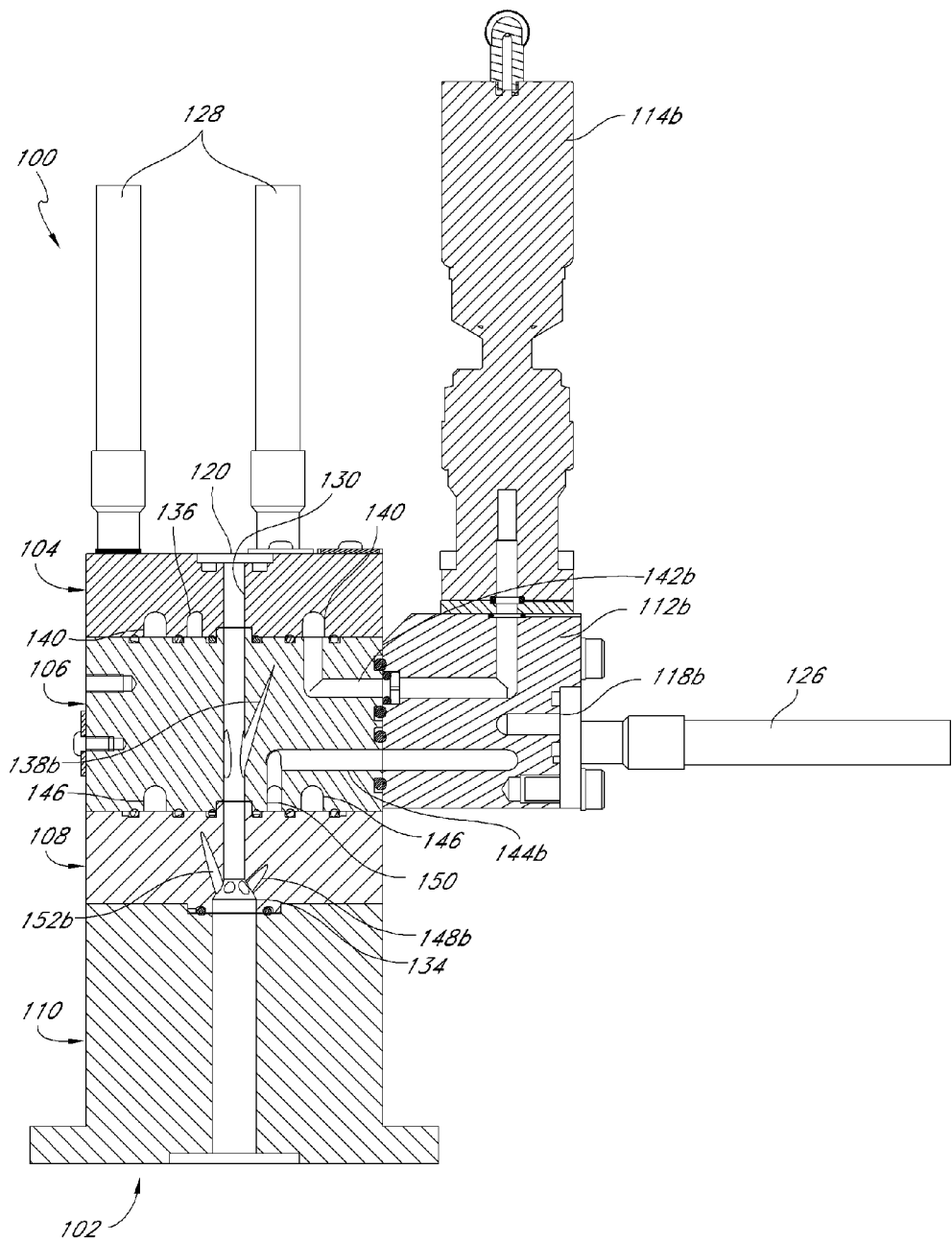
FIG. 3B is a cross-sectional view taken along lines 3B-3B of FIG. 2.

FIG. 3B is a cross-sectional view taken along lines 3B-3B of FIG. 2. As shown in FIG. 3B, the inert gas valve 114b controls a supply of inert gas from the passageway 142b (and thus, from the inert gas distribution channel 140) to the reactant gas valve 116b (see FIG. 2). The reactant gas valve 116b controls a supply of a reactant gas from the inlet 118b (or a mixture of a reactant gas from the inlet 118b and an inert gas from the inert gas valve 114b) to a passageway 144b, which is connected to a distribution channel 150 in the body 102. As shown in FIG. 3B, the passageway 144b extends through the valve block 112b and the intermediate block 106. The distribution channel 150 is formed by lower and upper surfaces, respectively, of the intermediate block 106 and the lower block 108, and extends in a plane that intersects the longitudinal axis of the bore 130, and is normal to the bore axis in the illustrated embodiment. In some embodiments, the distribution channel 150 can be disposed at about the same longitudinal location as the distribution channel 146. The distribution channel 150 is in fluid communication with the bore 130 via three supply channels 152a, 152b, 152c (only one of which is partially visible in FIG. 3B near its point of their merger with the bore 130), which connect with the bore 130 at a location downstream of the distribution channel 150.

In some embodiments, each of the distribution channels 136, 140, 146, and 150 can be fed by an inlet having a diameter slightly smaller than, or equal to, the diameter of its associated distribution channel. Also in some embodiments, each of the supply channels 138a, 138b, 138c, 148a, 148b, 148c, 152a, 152b, and 152c leading from the distribution channels can have a diameter which is slightly smaller than, or equal to, the diameter of its associated distribution channel. In some embodiments, the supply channels 138a, 138b, 138c, 148a, 148b, 148c, 152a, 152b, and 152c can have a diameter which is between 25% and 100% of the diameter of its associated distribution channel, and more preferably between about between 40% and 60% of the distribution channel diameter. Accordingly, back pressure is generated in each distribution channel such that the vapors are evenly distributed to the multiple associated supply channels leading therefrom.

The supply channels 138a, 138b, 138c, 148a, 148b, 148c, 152a, 152b, and 152c can connect with the bore 130 at an angle with respect to the longitudinal axis of the bore (as viewed in a longitudinal cross-sections of FIGS. 3A and 3B). As can be seen in FIG. 3B, the supply channels 148a, 148b, 148c from distribution channel 146 connect with the bore 130 at a greater angle than do the supply channels 152a, 152b, and 152c from the distribution channel 150, as the distribution channel 146 is laterally more remote from bore 130 than the distribution channel 150. In addition, some or all of the supply channels 138a, 138b, 138c, 148a, 148b, 148c, 152a, 152b, and 152c can connect tangentially with the bore 130 (i.e., out of alignment with the center of the bore, as viewed in a transverse cross-section, see FIG. 1C and related description). As also shown in FIG. 3B, the supply channels 148a, 148b, 148c, 152a, 152b, and 152c connect with the bore 130 at the tapered portion 134 of the bore. Such a configuration can serve to promote swirling and mixing of gases inside the bore 130.

While illustrated with three reactant inlets and two inert gas inlets to the manifold body 102, the number of precursor/reactant and inert gas inlets can vary in embodiments. Also, while illustrated with two each, the number of precursor/reactant valves 116a, 116b and inert gas valves 114a, 114a feeding distribution channels can vary in embodiments, depending on the particular application and the desired processing capability of the ALD system. Additionally, a reactant valve (not shown) controls any reactant provided through the distribution channel 136. Typically an ALD system includes at least two reactants and gas distribution therefor, and three- and four-reactant systems are not uncommon. In the embodiment illustrated in FIG. 2, the supply of reactant gas to the reactant gas inlet 124 can be controlled by a valve (not shown) which is disposed outside of the ALD hot zone. The valves 114a, 114b, 116a, and 116b may be any type of valve that can withstand high temperatures within the ALD hot zone. Valves 114a, 114b, 116a, and 116b may be ball valves, butterfly valves, check valves, gate valves, globe valves or the like. Metal diaphragm valves may also be used, and may be preferred for a high temperature environment (e.g., in temperatures up to about 220° C.). In some embodiments, the valves 114a, 114b, 116a, and 116b can be, for example and without limitation, pneumatically actuated valves or piezoelectric solenoid type valves. In embodiments, the valves 114a, 114b, 116a, and 116b can be configured to operate at very high speeds, for example, with opening and closing times of less than 80 ms, with speeds of less than 10 ms in some embodiments. The valves 114a, 114b, 116a, and 116b may be formed from any material that will function at the high temperatures required for ALD processing, such as 316L stainless steel and the like. Some embodiments, such as an ALD system configured for alumina deposition, can include valves configured to operate up to 220° C. Still other embodiments can include valves configured to operate at temperatures up to 300° C., up to 400° C., or at even higher temperatures.

Figure 4B:
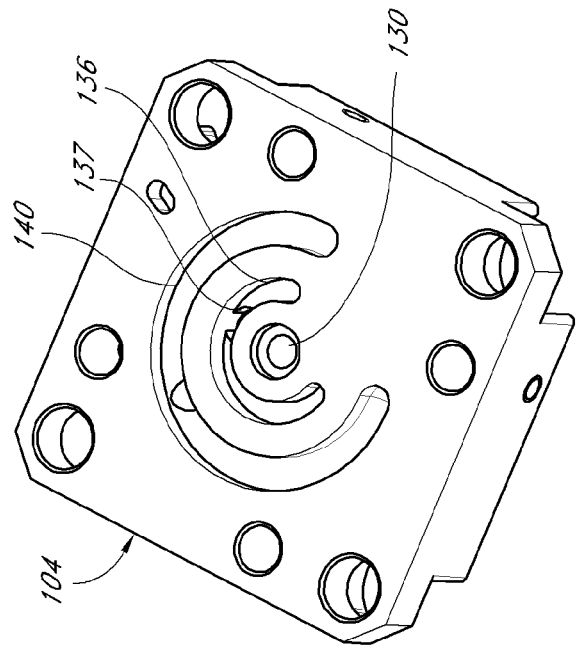
FIG. 4B is a bottom isometric view of the upper block of the manifold of FIG. 2.
Figure 4A:
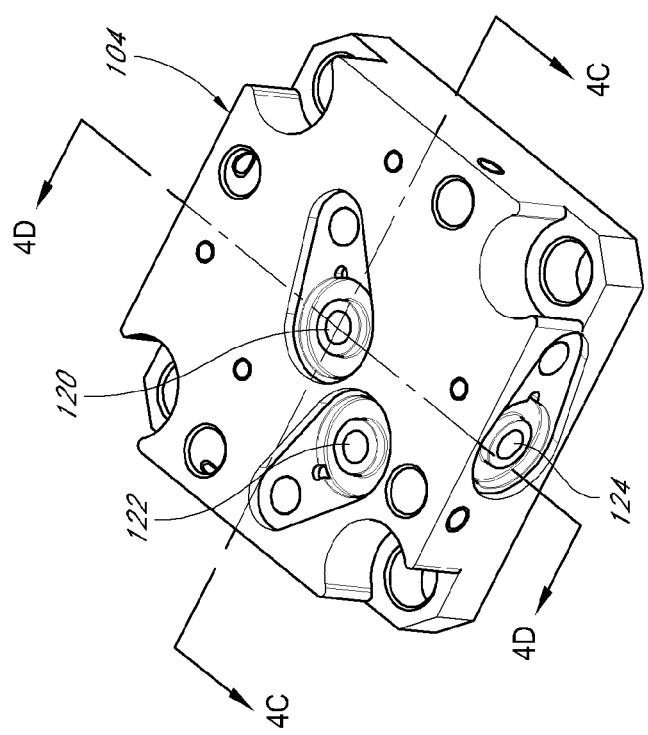
FIG. 4A is a top isometric view of the upper block of the manifold of FIG. 2.
Figure 4D:
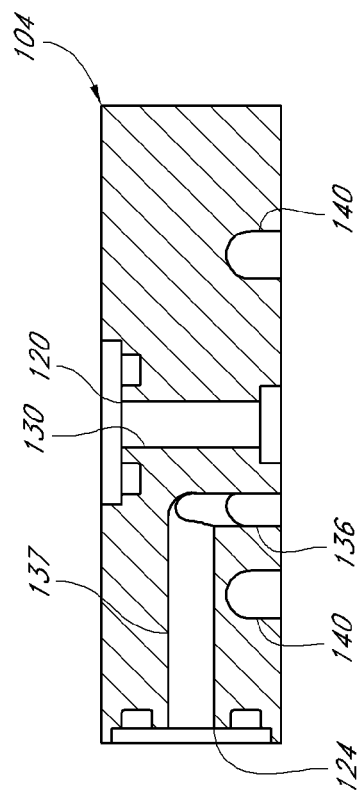
FIG. 4D is a cross-sectional view taken along lines 4D-4D of FIG. 4A.
Figure 4C:
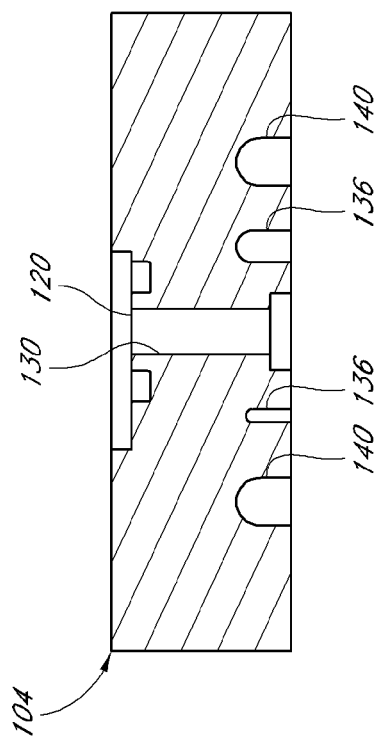
FIG. 4C is a cross-sectional view taken along lines 4C-4C of FIG. 4A.

FIG. 4A is a top isometric view of the upper block 104 of the manifold 100 and further illustrates the arrangement of the inert gas inlets 120, 122 and the reactant gas inlet 124. FIG. 4B is a bottom isometric view of the upper block 104 of the manifold 100 and further illustrates the configuration of the reactant gas distribution channel 136 and the inert gas distribution channel 140. As shown in FIG. 4B, the reactant gas distribution channel 136 and the inert gas distribution channel 140 can each follow a curved path, particularly of a circular curvature. In some embodiments, the reactant gas distribution channel 136 and the inert gas distribution channel 140 can be substantially concentric with the bore 130 and/or with one another. The reactant gas distribution channel 136 and the inert gas distribution channel 140 can each extend through an arc of greater than about 180°, more particularly about 240°, about the bore 130. In some embodiments, the reactant gas distribution channel 136 and the inert gas distribution channel 140 can extend through arcs which are slightly offset from (or rotated to) one another, as shown in FIG. 4B. In other embodiments, the reactant gas distribution channel 136 and the inert gas distribution channel 140 can extend through the same range of angles (i.e., through the same arc) about the bore 130, or they can extend through ranges which are angularly offset from one another, for example by 10° or more. FIGS. 4C and 4D are cross-sectional views taken along lines 4C-4C and 4D-4D, respectively, of FIG. 4A.

Figure 5B:
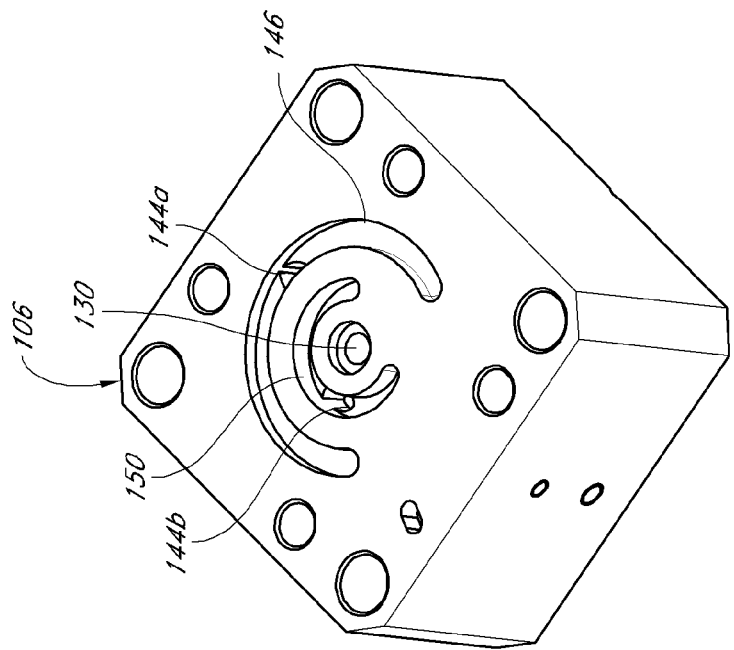
FIG. 5B is a bottom isometric view of the intermediate block of the manifold of FIG. 2.
Figure 5A:
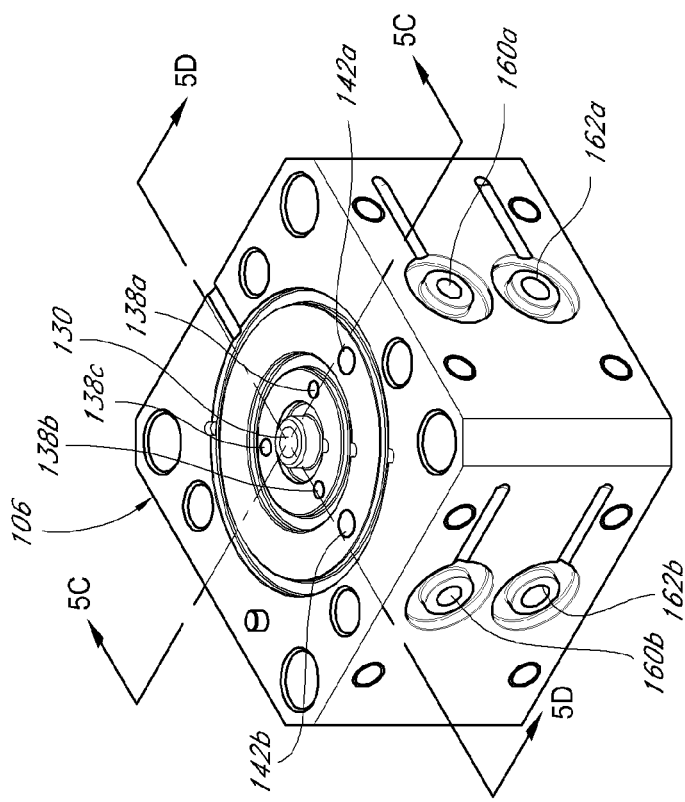
FIG. 5A is a top isometric view of the intermediate block of the manifold of FIG. 2.
Figure 5C:
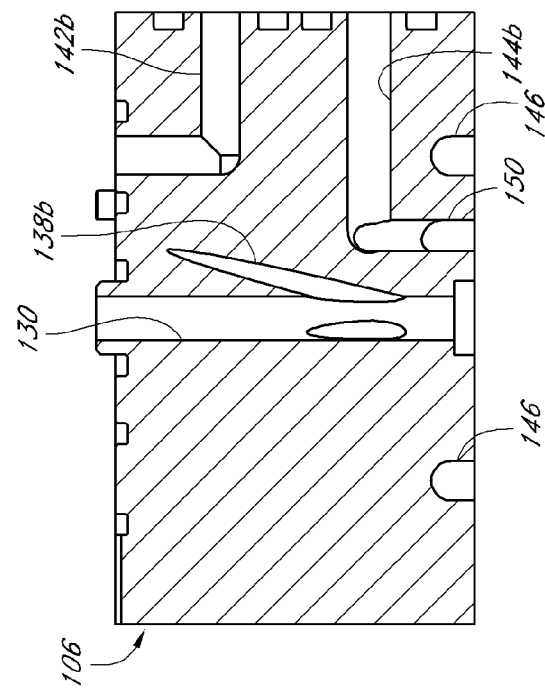
FIG. 5C is a cross-sectional view taken along lines 5C-5C of FIG. 5A.
Figure 5D:
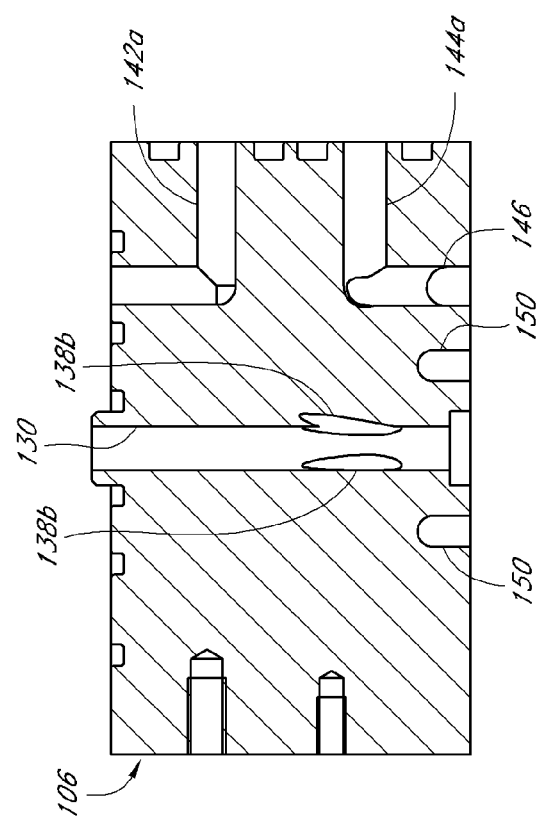
FIG. 5D is a cross-sectional view taken along lines 5D-5D of FIG. 5A.

FIG. 5A is a top isometric view of the intermediate block 106 and further illustrates the arrangement of the reactant gas supply channels 138a, 138b, 138c and the inert gas passageways 142a, 142b. FIG. 5A also illustrates openings 160a, 160b and 162a, 162b in the intermediate block 106 which form part of passageways 142a, 142b and 144a, 144b, respectively. FIG. 5B is a bottom isometric view of the intermediate block 106 and further illustrates the configuration of the reactant gas distribution channels 146, 150. As shown in FIG. 5B, the reactant gas distribution channels 146, 150 can each follow a curved path, particularly of circular curvature. In some embodiments, the reactant gas distribution channels 146, 150 can be substantially concentric with the bore 130 and/or with one another. The reactant gas distribution channels 146, 150 can each extend through an arc of greater than about 180°, particularly about 240°, about the bore 130. In some embodiments, the reactant gas distribution channel 136 and the inert gas distribution channel 140 can extend through arcs which are angularly offset or rotated to one another, as shown in FIG. 3B, which can facilitate feeding the channels from internal passageways. In other embodiments, the reactant gas distribution channels 146, 150 can extend through the same range of angles (i.e., through the same arc) about the bore 130. FIGS. 5C and 5D are cross-sectional views taken along lines 5C-5C and 5D-5D, respectively, of FIG. 5A.

Figure 6A:
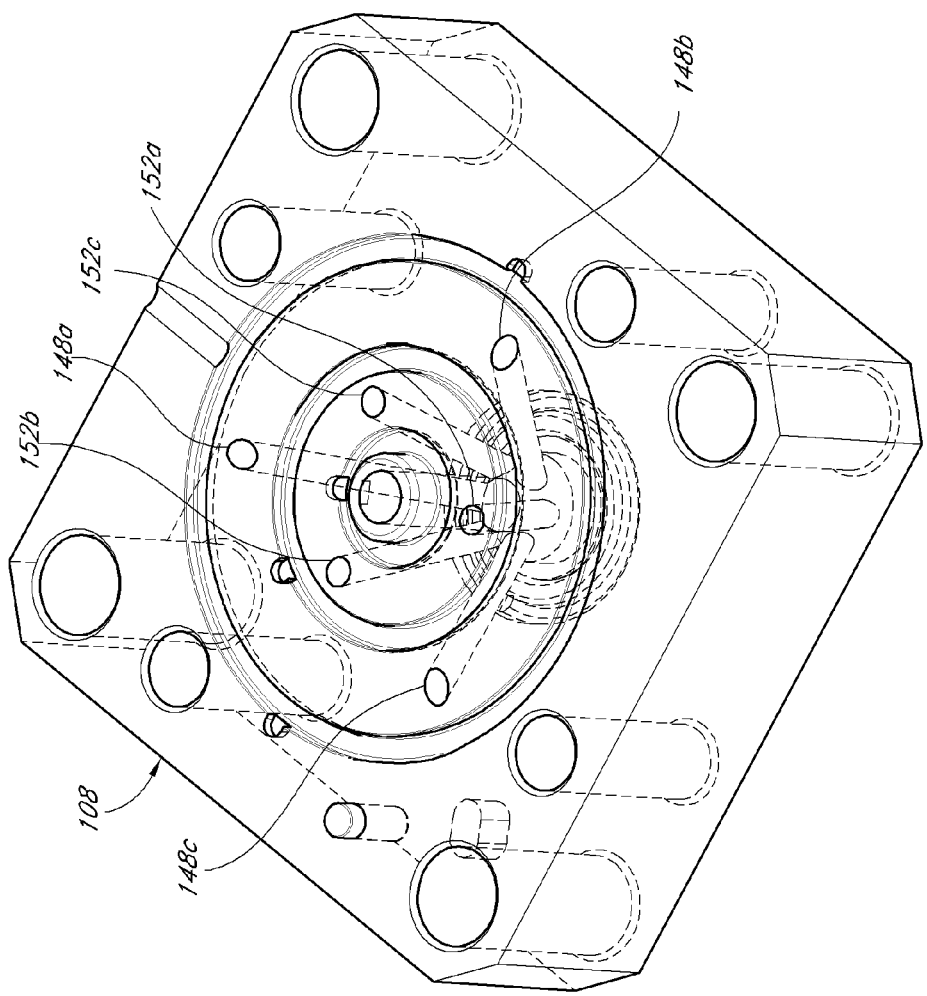
FIG. 6A is a top isometric view of the lower block of the manifold of FIG. 2.

FIGS. 6A and 6B are top isometric and plan views, respectively, of the lower block 108 of the manifold 100. FIGS. 6A and 6B further illustrate in dotted lines the arrangement of the reactant gas supply channels 148a, 148b, 148c and 152a, 152b, 152c in three dimensions. FIG. 6C is a cross-sectional view taken along lines 6C-6C of FIG. 6B, and illustrates the connection of the reactant gas supply channels 148b and 152b with the tapered portion 134 of the bore 130.

Figure 7B:
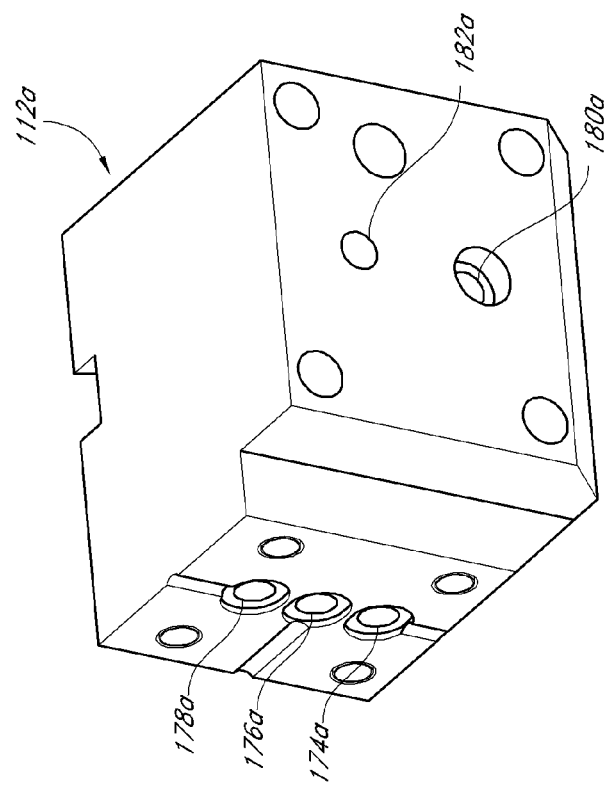
FIG. 7B is a bottom isometric view of the valve block shown in FIG. 7A.
Figure 7A:
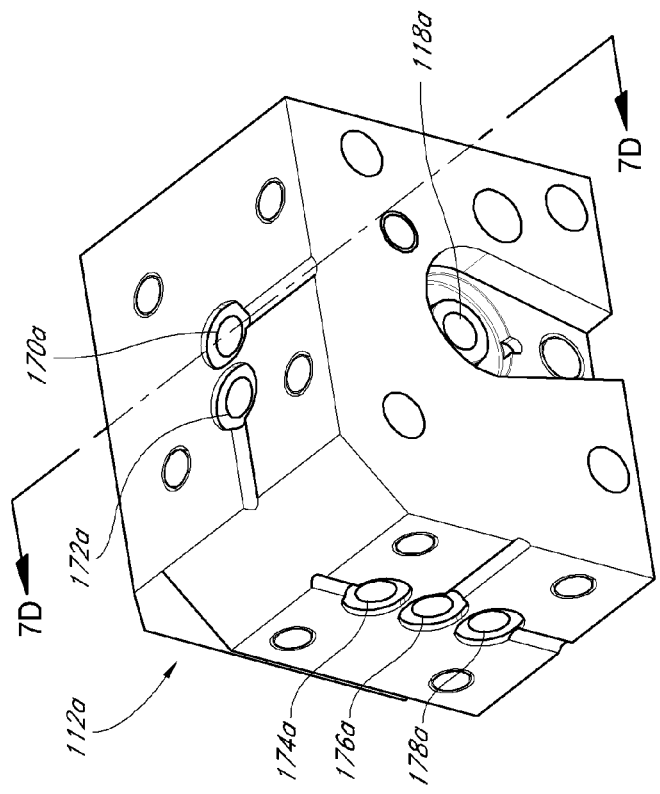
FIG. 7A is a top isometric view of one of the valve blocks of the manifold of FIG. 2.

FIGS. 7A and 7B are top and bottom isometric views, respectively, of the valve block 112a of the manifold 100 and illustrate openings 170a, 172a, 174a, 176a, 178a, 180a, and 182a in the valve block 112a. During operation, inert gas from the passageway 142a in the intermediate block 106 is conveyed into opening 180a, through a passageway in the valve block 112a, and into the inert gas valve 114a through opening 170a. Inert gas from the inert gas valve 114a travels into opening 172a, through a passageway in the valve block 112a, and into the reactant gas valve 116a through opening 174a. Reactant gas from the inlet 118a travels through opening 176a to the reactant gas valve 116a. Reactant gas (and/or a mixture of reactant gas and inert gas) from the reactant gas valve 116a is conveyed into opening 178a, through a passageway in the valve block 112a, and into the intermediate block 106 through opening 182a.

Figure 7D:
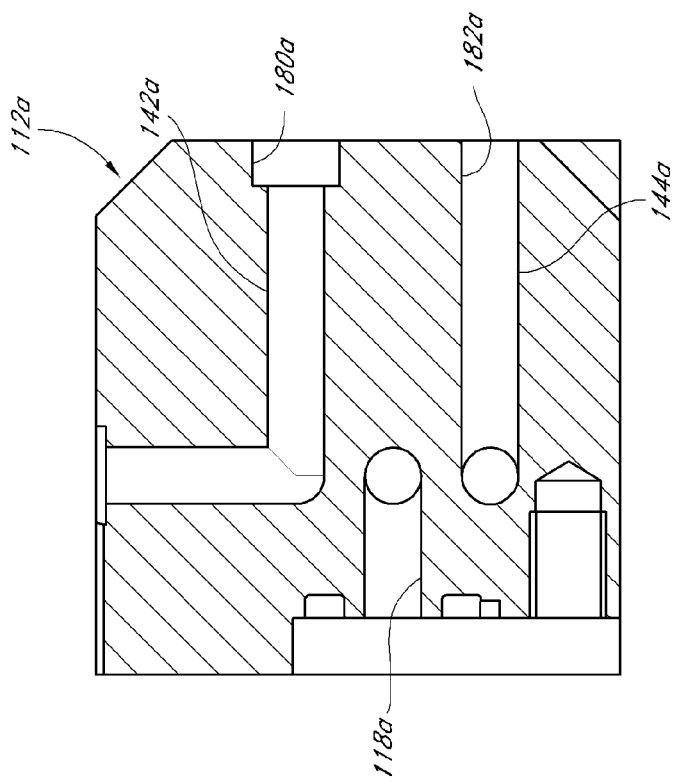
FIG. 7D is a cross-sectional view taken along lines 7D-7D of FIG. 7A.
Figure 7C:
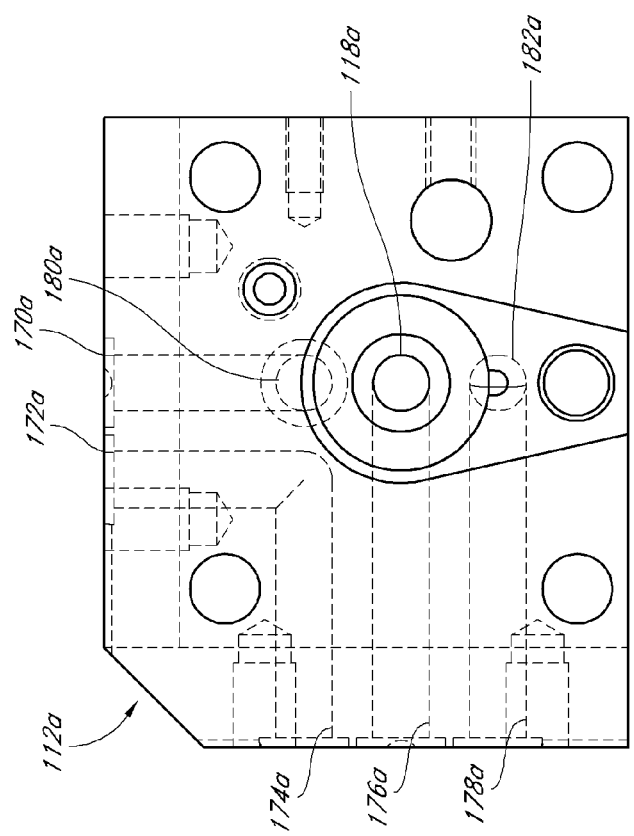
FIG. 7C shows a side view of the valve block shown in FIG. 7A, with internal passages shown in dashed lines.

FIG. 7C shows a side view of the valve block shown in FIG. 7A, with the internal passages connecting the various openings 170a, 172a, 174a, 176a, 178a, 180a, and 182a shown in dashed lines. FIG. 7D is a cross-sectional view taken along lines 7D-7D of FIG. 7A.

Figure 8:
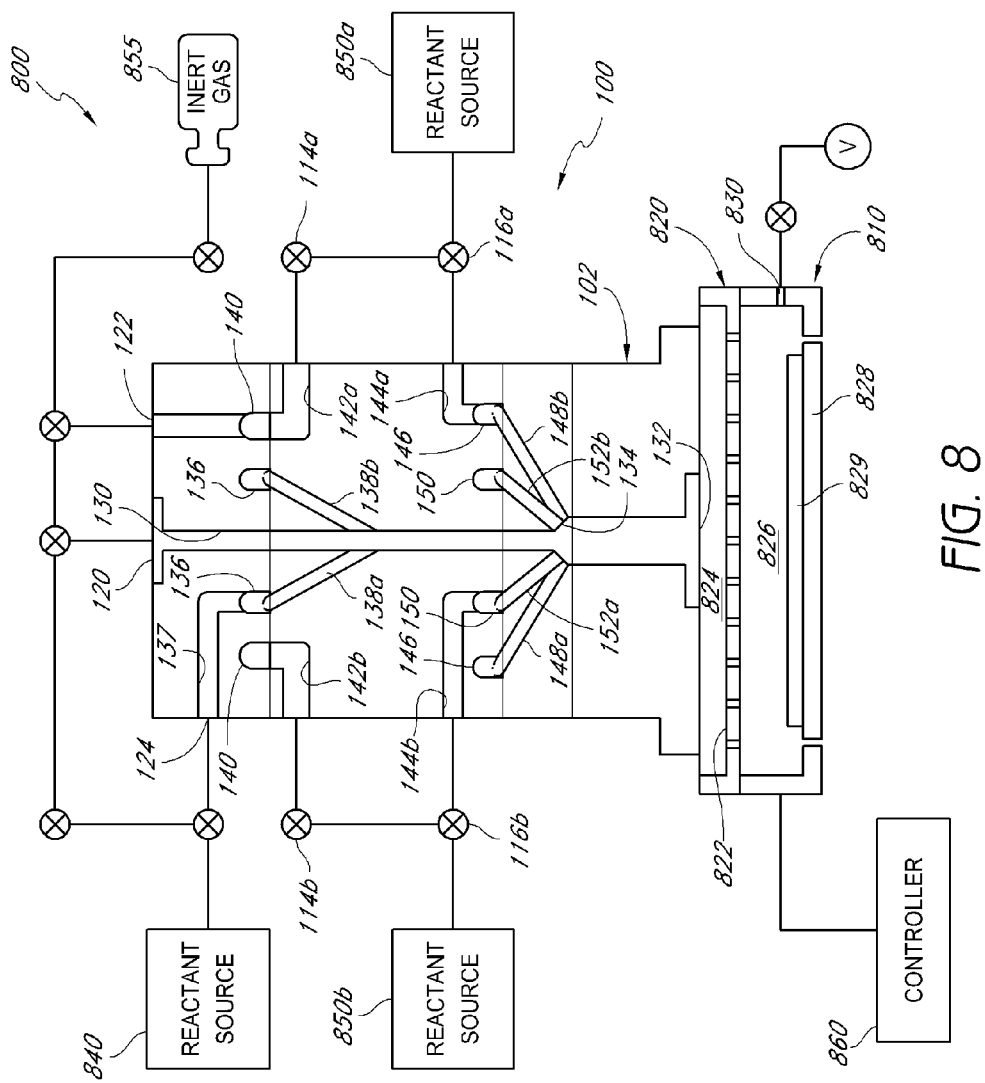
FIG. 8 is a schematic view showing an ALD device according to an embodiment.

FIG. 8 is a schematic view of a reactor 800 including the manifold 100 of FIGS. 2-7D with connections to reactant and inert gas sources, control systems, a gas dispersion device and a reaction chamber. For ease of illustration, two supply channels from each set of angled supply channels 138a, 138b, 138c, 148a, 148b, 148c, 152a, 152b, 152c are shown merging with the bore 130. Similarly, paths for three potential reactants are shown, despite the fact that the passages would not all be visible in a single cross-section.

The manifold body 102 is shown connected upstream of a reaction chamber 810. In particular, the outlet 132 of the bore 130 communicates with a reactant injector, particularly a dispersion mechanism in the form of a showerhead 820 in the illustrated embodiment. The showerhead 820 includes a showerhead plate 822 that defines a showerhead plenum 824 above the plate 822. The showerhead 820 communicates vapors from the manifold 100 to a reaction space 826 below the showerhead 820. The reaction chamber 810 includes a substrate support 828 configured to support a substrate 829 in the reaction space 826. The reaction chamber also includes an exhaust opening 830 connected a vacuum source. While shown with a single-wafer, showerhead type of reaction chamber, the skilled artisan will appreciate that manifold can also be connected to other types of reaction chambers with other types of injectors, e.g. batch or furnace type, horizontal or cross-flow reactor, etc.

The manifold block 102 is also connected via various valves and gas lines to inert gas and reactant sources. In the illustrated embodiment, three reactant sources are shown, although fewer or greater numbers can be provided in other arrangements. In the illustrated embodiment, the upper reactant distribution channel 136 connects, via the passageway 137, external gas lines and control valves, to a reactant source 840. The lower reactant distribution channels 146, 150 connect, via the passageways 144a, 144b, the reactant valves 116a, 116b and external gas lines to reactant sources 850a, 850b, respectively. In some embodiments, one or more of the reactant sources 840, 850a, and 850b can contain a naturally gaseous ALD reactant, such as $H_2$, $NH_3$, $N_2$, $O_2$, or $O_3$. Additionally or alternatively, one or more of the reactant sources 840, 850a, and 850b can include a vaporizer for vaporizing a reactant which is solid or liquid at room temperature and atmospheric pressure. The vaporizer(s) can be, e.g., liquid bubblers or solid sublimation vessels. Examples of solid or liquid reactants that can be held and vaporized in a vaporizer include, without limitation, liquid organometallic precursors such as trimethylaluminum (TMA), TEMAHf, or TEMAZr; liquid semiconductor precursors, such as dichlorosilane (DCS), trichlorosilane (TCS), trisilane, organic silanes, or TiCl4; and powdered precursors, such as $ZrCl_4$ or $HfCl_4$. The skilled artisan will appreciate that embodiments can include any desired combination and arrangement of naturally gaseous, solid or liquid reactant sources. For example, in one embodiment, the upper reactant source 840 can contain a naturally gaseous reactant, while the lower reactant sources 850a, 850b can be vaporizers for solids or liquids. In another embodiment, the upper reactant source 840 can be a vaporizer, while the lower reactant sources 850a, 850b can contain a naturally gaseous reactant. In still another embodiment, one each of the lower reactant sources 850a, 850b can provide a naturally gaseous reactant and a vaporizer.

The reactor 800 also includes at least one inert gas source 855. FIG. 8 shows the inert gas source 855 as providing purge gas to the reactant valves 116a, 116b and thus to the lower reactant distribution channels 146, 150 (via the inert gas inlet 122, distribution channel 140, passageways 142a, 142b and inert gas valve 114a). The same inert gas source 855 is shown feeding the top of the central bore 130 (via the inert gas inlet 120). The same inert gas source also purges the upper reactant distribution channel 136 (via the reactant inlet 124 and the passageway 137. However, separate inert gas sources can be provided for each of these feeds.

The reactor 800 also includes at least one controller 860, including processor(s) and memory with programming for controlling various components of the reactor 800. While shown schematically as connected to the reaction chamber 810, the skilled artisan will appreciate that the controller 860 communicates with various components of the reactor, such as vapor control valves, heating systems, gate valves, robot wafer carriers, etc., to carry out deposition processes.

In operation, the controller 860 arranges for a substrate 829 to be loaded onto the substrate support 828, and for the reaction chamber 810 to be closed, purged and typically pumped down in readiness for deposition processes, particularly atomic layer deposition (ALD). A typical ALD sequence will now be described with reference to the reactor components of FIG. 8.

In one embodiment, prior to reactant supply and during the entire ALD process, purge gas flows through the top inlet 120 into the bore 130. When the controller instructs a first ALD reactant pulse, for example from the reactant source 850a, the reactant valve 116a is open to permit flow from the reactant source 850a into the passageway 144a and around the distribution channel 146. Backpressure within the distribution channel 146 ensures even distribution among the multiple supply channels 148a, 148b, 148c leading from the distribution channel 146 to the bore 130, where the first reactant merges with the inert gas flow. At the same time, inert gas can flow through all other reactant channels (e.g., the reactant distribution channel 136, the supply channels 138a, 138b, 138c, the reactant distribution channel 150 and supply channels 152a, 152b, 152c) into the bore 130. From the bore 130, the mixture of inert gas and first reactant is fed to the showerhead plenum 824 and distributed across the showerhead plate 822 (or other dispersion mechanism) and into the reaction space 826. During this first reactant pulse, the narrower portion of the bore 130 upstream of the tapered portion 134 is filled with flowing inert gas and prevents upstream diffusion of the reactant.

After a sufficient duration to saturate the substrate 829 surface with the first reactant, the controller 860 switches off the reactant valve 116a, opens the inert gas valve 114a, and thus purges the reactant valve 116a, the passageway 144a, the reactant distribution channel 146 and the depending supply channels 148a, 148b, 148c. Inert gas can continue to be supplied through the bore 130 from the top inlet 120 and the other reactant pathways for a sufficient duration to purge the manifold 100, the showerhead plenum 824, and the reaction space 826 of any remaining first reactant and/or byproduct. The skilled artisan will appreciate that other reactant removal procedures can be used in place of or in addition to purging.

After a suitably long removal period to avoid interaction of the first reactant with the subsequent reactant, the controller 860 can instruct control valves to supply a second ALD reactant from, e.g., the gaseous reactant source 840, into the reactant inlet 124, the passageway 137 and the upper reactant distribution channel 136. Backpressure within the distribution channel 136 ensures even distribution among the multiple supply channels 138a, 138b, 138c leading from the distribution channel 136 to the bore 130, where the first reactant merges with the inert gas flow. At the same time, inert gas can flow through all other reactant channels (e.g., the reactant distribution channel 146, the supply channels 148a, 148b, 148c, the reactant distribution channel 150 and supply channels 152a, 152b, 152c) into the bore 130. From the bore 130, the mixture of inert gas and first reactant is fed to the showerhead plenum 824 and distributed across the showerhead plate 822 (or other dispersion mechanism) and into the reaction space 826. During this second reactant pulse, the portion of the bore 130 upstream of its merger with the supply channels 138a, 138b, 138c is filled with flowing inert gas, which prevents upstream diffusion of the second reactant. Similarly, the flow of inert gas through all other reactant flow paths prevents backwards diffusion of the second reactant.

Following saturative surface reaction on the substrate, a removal step similar to the purge step described above can be performed, including purging of the distribution channel 136 and its depending supply channels 138a, 138b, 138c. The above described cycle can be repeated until a sufficiently thick layer is formed on the substrate 829.

Figure 9:
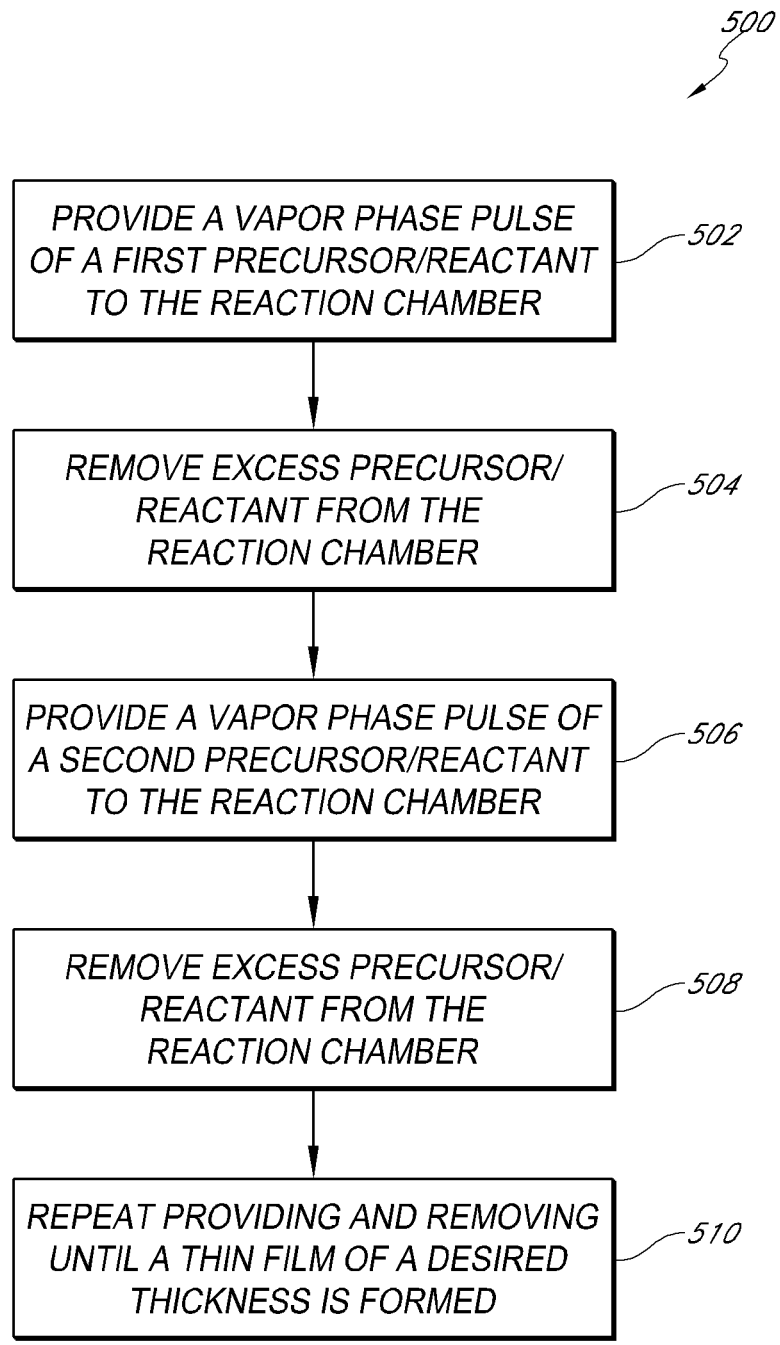
FIG. 9 is a flow chart generally illustrating a method for forming a thin film in accordance with one embodiment.

FIG. 9 is a flow chart generally illustrating a method 500 for forming a thin film in accordance with one embodiment. At block 502, a vapor phase pulse of a first precursor/reactant can be provided to the reaction chamber. At block 504, any excess of the first precursor/reactant can be removed from the reaction chamber. At block 506, a vapor phase pulse of a second precursor/reactant can be provided to the reaction chamber. At block 508, any excess of the second precursor/reactant (along with any reaction byproducts, if any) can be removed from the reaction chamber. Blocks 502-508 can together be referred to as a deposition cycle, and of course the cycle can include additional pulses of additional precursors or reactants. At block 510, the deposition cycle can be repeated until a film of a desired thickness is formed. In some embodiments, the process 500 can be controlled by a control system, such as the controller 860 of FIG. 8, which may include a computer having one or more processors executing control programming information (e.g., defining the sequence and parameters of each precursor, reactant, and purge step) stored in memory.

Although the foregoing has been described in detail by way of illustrations and examples for purposes of clarity and understanding, it is apparent to those skilled in the art that certain changes and modifications may be practiced. Therefore, the description and examples should not be construed as limiting the scope of the invention to the specific embodiments and examples described herein, but rather to also cover all modification and alternatives coming with the true scope and spirit of the invention. Moreover, not all of the features, aspects and advantages described herein above are necessarily required to practice the present invention.

What is claimed is:

1. A vapor deposition device comprising:
 a reactor including a reaction chamber, a substrate support configured to support a substrate, and an injector configured to inject vapor into the reaction chamber, the injector comprising a showerhead mechanism disposed over the substrate support, the showerhead mechanism comprising a showerhead plate and defining a showerhead plenum, the showerhead plate including a plurality of non-annular openings to inject the vapor into the reaction chamber, each opening of the plurality of openings defining a channel disposed along a first direction; and a manifold configured to deliver vapor to the injector, the manifold being disposed upstream of the injector, the manifold comprising:
  a manifold body having a hollow bore disposed within the body, the bore having a longitudinal axis along which gas flows, the longitudinal axis generally parallel with the first direction, the manifold body comprising a first block and a second block disposed adjacent the first block,
  a first distribution channel disposed within the body and extending in a plane intersecting the longitudinal axis, wherein the first distribution channel is defined by a groove formed in at least one of a lower surface of the first block and an upper surface of the second block, the groove disposed at least partially about the bore to direct gas circumferentially relative to the bore,
  a plurality of first supply channels disposed within the body and in flow communication with the first distribution channel and with the bore, each of the first supply channels being disposed at an acute angle with respect to the longitudinal axis of the bore, each of the first supply channels connecting with the bore at a different angular position about the longitudinal axis, and
  an inert gas inlet configured to fluidly connect to an inert gas source, wherein a portion of the bore extends upstream and downstream of the first distribution channel and the first supply channels along the longitudinal axis, the inert gas inlet disposed upstream of the first distribution channel and the first supply channels, the inert gas inlet directed along the longitudinal axis of the bore to supply inert gas through the bore along the longitudinal axis.

2. The vapor deposition device of claim 1, further comprising the inert gas source, the inert gas source coupled to the inert gas inlet upstream of where the first supply channels connect with the bore.

3. The vapor deposition device of claim 1, wherein the first distribution channel extends in a plane normal to the longitudinal axis.

4. The vapor deposition device of claim 1, wherein each of the first supply channels connects with the first distribution channel at a different angular position about the longitudinal axis.

5. The vapor deposition device of claim 1, wherein the first distribution channel has a curved shape.

6. The vapor deposition device of claim 5, wherein the first distribution channel follows a circular curvature.

7. The vapor deposition device of claim 1, wherein the first distribution channel extends through an arc of at least 180°.

8. The vapor deposition device of claim 1, wherein the first distribution channel extends through an arc of about 240°.

9. The vapor deposition device of claim 1, wherein the different angular positions are disposed symmetrically about the longitudinal axis.

10. The vapor deposition device of claim 1, wherein the manifold comprises three first channels, and wherein the different angular positions are spaced apart by approximately 120°.

11. The vapor deposition device of claim 1, wherein the different angular positions are disposed asymmetrically about the longitudinal axis.

12. The vapor deposition device of claim 1, wherein each of the first channels extends radially from the bore, as viewed in a transverse cross-section.

13. The vapor deposition device of claim 1, wherein each of the first supply channels extends tangentially or semitangentially from the bore, as viewed in a transverse cross-section.

14. The vapor deposition device of claim 1, wherein an inlet to the first distribution channel has a diameter approximately equal to a diameter of the first distribution channel.

15. The vapor deposition device of claim 14, wherein each of the first supply channels has a diameter between 25% and 100% of a diameter of the first distribution channel.

16. The vapor deposition device of claim 1, wherein the first distribution channel is connected to a first reactant source.

17. The vapor deposition device of claim 1, wherein the bore has a length-to-diameter (L/D) ratio of greater than 5, where the length is measured from where the first supply channels connect with the bore to an outlet of the bore, and the diameter is an average diameter along the length.

18. The vapor deposition device of claim 17, wherein the manifold body further comprises:
  a second distribution channel disposed within the body and extending in a plane intersecting the longitudinal axis; and
  a plurality of second supply channels disposed within the body and in flow communication with the second distribution channel and with the bore, each of the second supply channels being disposed at an acute angle with respect to the longitudinal axis of the bore, each of the second supply channels connecting with the bore at a different angular position about the longitudinal axis.

19. The vapor deposition device of claim 18, wherein the first reactant source is configured to hold a gas, wherein the second distribution channel is connected to a second reactant source, the second reactant source including a precursor vaporizer wherein the second supply channels connect with the bore downstream of where the first supply channels connect with the bore.

20. The vapor deposition device of claim 19, wherein the manifold body further comprises:
  a third distribution channel disposed within the body and extending in a plane intersecting the longitudinal axis; and
  a plurality of third supply channels disposed within the body and in flow communication with the third distribution channel and with the bore, each of the third supply channels being disposed at an acute angle with respect to the longitudinal axis of the bore, each of the third supply channels connecting with the bore at a different angular position about the longitudinal axis.

21. The vapor deposition device of claim 20, wherein the third distribution channel extends in substantially the same plane as the second distribution channel.

22. The vapor deposition device of claim 20, the third supply channels connect with the bore at approximately the same longitudinal location as the second supply channels.

23. The vapor deposition device of claim 20, wherein the third distribution channel is connected to a third reactant source, the third reactant source including another precursor vaporizer.

24. The vapor deposition device of claim 18, further comprising a first reactant gas valve mounted on the manifold, the first reactant gas valve configured to control a supply of the second reactant to the second distribution channel.

25. The vapor deposition device of claim 24, further comprising a first inert gas valve mounted on the manifold, the first inert gas valve configured to control a supply of an inert gas to the first reactant gas valve.

26. The vapor deposition device of claim 1, wherein the groove comprises a floor having a curved surface, as viewed from a side cross-section.

27. The vapor deposition device of claim 1, further comprising a second distribution channel disposed within the body, the first distribution channel comprising an annulus surrounding the second distribution channel.

28. The vapor deposition device of claim 27, further comprising a plurality of second supply channels disposed within the body and in flow communication with the second distribution channel and with the bore, each of the second supply channels being disposed at an acute angle with respect to the longitudinal axis of the bore.

29. A vapor deposition device comprising:
a reactor including a reaction chamber, a substrate support configured to support a substrate, and an injector configured to inject vapor into the reaction chamber, the injector comprising a showerhead mechanism disposed over the substrate support, the showerhead mechanism comprising a showerhead plate and defining a showerhead plenum, the showerhead plate including a plurality of non-annular openings to inject the vapor into the reaction chamber, each opening of the plurality of openings defining a channel disposed along a first direction; and
a manifold configured to deliver vapor to the injector, the manifold being disposed upstream of the injector, the manifold comprising:
a manifold body having a hollow bore disposed within the body, the bore having a longitudinal axis along which gas flows, the longitudinal axis generally parallel with the first direction, the manifold body comprising a first block and a second block disposed adjacent the first block,
a first distribution channel disposed within the body and extending in a plane intersecting the longitudinal axis, wherein the first distribution channel is defined by a groove formed in at least one of a lower surface of the first block and an upper surface of the second block, the groove disposed at least partially about the bore to direct gas circumferentially relative to the bore, and
a plurality of first supply channels disposed within the body and in flow communication with the first distribution channel and with the bore, each of the first supply channels being disposed at an acute angle with respect to the longitudinal axis of the bore, each of the first supply channels connecting with the bore at a different angular position about the longitudinal axis.

30. The vapor deposition device of claim 29, further comprising a third block disposed adjacent the second block and a second distribution channel disposed within the body and extending in a second plane intersecting the longitudinal axis, wherein the second distribution channel is defined by a lower surface of the second block and an upper surface of the third block.

31. The vapor deposition device of claim 29, wherein the first distribution channel extends through an arc of at least 180°.

32. A vapor deposition device comprising:
a reactor including a reaction chamber, a substrate support configured to support a substrate, and an injector configured to inject vapor into the reaction chamber, the injector comprising a showerhead mechanism disposed over the substrate support, the showerhead mechanism comprising a showerhead plate and defining a showerhead plenum, the showerhead plate including a plurality of non-annular openings to inject the vapor into the reaction chamber, each opening of the plurality of openings defining a channel disposed along a first direction; and
a manifold configured to deliver vapor to the injector, the manifold being disposed upstream of the injector, the manifold comprising:
a manifold body having a hollow bore disposed within the body, the bore having a longitudinal axis along which gas flows, the longitudinal axis generally parallel with the first direction, the manifold body comprising a first block and a second block disposed adjacent the first block,
a first distribution channel disposed within the body and extending in a plane intersecting the longitudinal axis, wherein the first distribution channel is defined by a groove formed in at least one of a lower surface of the first block and an upper surface of the second block, the groove disposed at least partially about the bore to direct gas circumferentially relative to the bore,
a plurality of first supply channels disposed within the body and in flow communication with the first distribution channel and with the bore, each of the first supply channels being disposed at an acute angle with respect to the longitudinal axis of the bore,
a second distribution channel disposed within the body and extending in the same plane as the first distribution channel, the first distribution channel surrounding the second distribution channel,
a plurality of second supply channels disposed within the body and in flow communication with the second distribution channel and with the bore, each of the second supply channels being disposed at an acute angle with respect to the longitudinal axis of the bore.

33. The vapor deposition device of claim 32, wherein the respective acute angle formed between the second supply channels and the longitudinal axis is larger than the respective acute angle formed between the first supply channels and the longitudinal axis.

34. The vapor deposition device of claim 32, wherein the first distribution channel extends through an arc of at least 180°.

35. The vapor deposition device of claim 32, further comprising an inert gas source coupled to an inlet of the bore upstream of where the first supply channels connect with the bore.

36. The vapor deposition device of claim 32, wherein the first distribution channel extends in a plane normal to the longitudinal axis.

37. The vapor deposition device of claim 1, wherein the showerhead plate is at least as large as the substrate support.

38. The vapor deposition device of claim 29, wherein the showerhead plate is at least as large as the substrate support.

39. The vapor deposition device of claim 32, wherein the showerhead plate is at least as large as the substrate support.

40. The vapor deposition device of claim 32, wherein the first distribution channel comprises a first annular channel disposed at least partially about the bore, and wherein the second distribution channel comprises a second annular channel disposed at least partially about the bore.

* * * * *